(12) United States Patent
Takemura et al.

(10) Patent No.: US 9,083,313 B2
(45) Date of Patent: Jul. 14, 2015

(54) SUBSTRATE, DUPLEXER AND SUBSTRATE MODULE

(71) Applicant: Murata Manufacturing Co., Ltd., Nagaokakyo-shi, Kyoto-fu (JP)

(72) Inventors: Tadaji Takemura, Nagaokakyo (JP); Syuji Yamato, Nagaokakyo (JP); Takanori Uejima, Nagaokakyo (JP); Morio Takeuchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 123 days.

(21) Appl. No.: 13/947,339

(22) Filed: Jul. 22, 2013

(65) Prior Publication Data

US 2013/0307637 A1 Nov. 21, 2013

Related U.S. Application Data

(63) Continuation of application No. PCT/JP2012/055040, filed on Feb. 29, 2012.

(30) Foreign Application Priority Data

Mar. 3, 2011 (JP) ................................. 2011-045978
Aug. 25, 2011 (JP) ................................. 2011-183495

(51) Int. Cl.
*H03H 9/72* (2006.01)
*H03H 9/64* (2006.01)
(Continued)

(52) U.S. Cl.
CPC ............. *H03H 9/6406* (2013.01); *H01P 1/213* (2013.01); *H03H 9/0576* (2013.01); *H03H 9/725* (2013.01); *H04B 1/52* (2013.01); *H04B 1/525* (2013.01); *H03H 9/6436* (2013.01)

(58) Field of Classification Search
CPC ............. H03H 9/15; H03H 9/25; H03H 9/54; H03H 9/64
USPC .......................................... 333/133, 193–196
See application file for complete search history.

(56) References Cited

U.S. PATENT DOCUMENTS 7,298,231 B2 * 11/2007 Ikuta et al. .................... 333/133
7,385,463 B2 *  6/2008 Koga et al. .................... 333/133
(Continued)

FOREIGN PATENT DOCUMENTS

JP 2000-077954 A 3/2000
JP 2001-168242 A 6/2001
(Continued)

OTHER PUBLICATIONS

Official Communication issued in corresponding German Patent Application No. 11 2012 001 081.7, mailed on Apr. 29, 2014.
(Continued)

*Primary Examiner* — Dean Takaoka
(74) *Attorney, Agent, or Firm* — Keating & Bennett, LLP

(57) ABSTRACT

In a substrate that improves isolation characteristics of a high-frequency-side signal path and a low-frequency-side signal path, a duplexer, and a substrate module, a package substrate includes two SAW filters mounted thereon and defines a portion of the duplexer. A substrate body includes main surfaces that oppose each other. Land electrodes are provided on one of the main surfaces and are used to connect either of the two SAW filters. Land electrodes are provided on one of the main surfaces and are used to connect a mounting substrate on which the duplexer is mounted and are respectively superposed with the land electrodes when viewed in plan from a z-axis direction. The land electrodes and the land electrodes, which are superposed with each other when viewed in plan from the z-axis direction, are electrically connected to each other.

21 Claims, 19 Drawing Sheets

(51) Int. Cl.
*H01P 1/213* (2006.01)
*H03H 9/05* (2006.01)
*H04B 1/52* (2015.01)
*H04B 1/525* (2015.01)
*H03H 7/46* (2006.01)

(56) References Cited

U.S. PATENT DOCUMENTS

| | | |
|---|---|---|
| 2002/0058151 A1 | 5/2002 | Uchikoba et al. |
| 2003/0214368 A1 | 11/2003 | Taniguchi |
| 2004/0212451 A1 | 10/2004 | Iwamoto et al. |
| 2008/0218927 A1 | 9/2008 | Harada et al. |
| 2008/0290965 A1 | 11/2008 | Pitschi et al. |
| 2011/0032051 A1 | 2/2011 | Kawamoto et al. |
| 2011/0181372 A1 | 7/2011 | Fujita |

FOREIGN PATENT DOCUMENTS

| | | |
|---|---|---|
| JP | 2002-043811 A | 2/2002 |
| JP | 2002-100877 A | 4/2002 |
| JP | 2003-332885 A | 11/2003 |
| JP | 2004-260375 A | 9/2004 |
| JP | 2004-328676 A | 11/2004 |
| JP | 2006-101550 A | 4/2006 |
| JP | 2006-304145 A | 11/2006 |
| JP | 2007-129459 A | 5/2007 |
| JP | 2007-142812 A | 6/2007 |
| JP | 2009-273120 A | 11/2009 |
| JP | 2009-290606 A | 12/2009 |
| JP | 2010-068079 A | 3/2010 |
| WO | 2010/052821 A1 | 5/2010 |

OTHER PUBLICATIONS

Official Communication issued in International Patent Application No. PCT/JP2012/055040, mailed on Apr. 17, 2012.

* cited by examiner

SUBSTRATE, DUPLEXER AND SUBSTRATE MODULE

BACKGROUND OF THE INVENTION

1. Field of the Invention

The present invention relates to substrates, duplexers, substrate modules and manufacturing methods therefor, and more specifically relates to a substrate on which a high-frequency-side filter component and a low-frequency-side filter component are mounted, and to a duplexer and a substrate module.

2. Description of the Related Art

A branching filter described in Japanese Unexamined Patent Application Publication No. 2009-290606 is a known example of a duplexer of the related art. The duplexer described in Japanese Unexamined Patent Application Publication No. 2009-290606 is formed by mounting a piezoelectric substrate, which has a transmission surface acoustic wave filter and a reception surface acoustic wave filter provided on one main surface thereof, on a circuit board. This kind of circuit board, for example, is mounted on a motherboard of a wireless communication device.

In the branching filter described in Japanese Unexamined Patent Application Publication No. 2009-290606, inductor patterns for matching the transmission surface acoustic wave filter and the reception surface acoustic wave filter are built into the circuit board. As a result, when wiring lines such as inductor patterns are provided inside the circuit board, a transmission signal path and a reception signal path are close to each other and liable to become electromagnetically coupled. As a result, there is a risk of a transmission high frequency signal entering the reception signal path and thus the isolation characteristics of transmission and reception being degraded.

SUMMARY OF THE INVENTION

Accordingly, preferred embodiments of the present invention provide a substrate capable of improving the isolation characteristics of a high-frequency-side signal path and a low-frequency-side signal path, and a duplexer and a substrate module.

A substrate according to a preferred embodiment of the present invention has mounted thereon a high-frequency-side filter component and a low-frequency-side filter component and defines a portion of a duplexer. The substrate includes a substrate body including a first main surface and a second main surface, which oppose each other, a plurality of first mounting electrodes that are provided on the first main surface and that are used for connection of the high-frequency-side filter component or the low-frequency-side filter component, and a plurality of second mounting electrodes that are provided on the second main surface and that are used for connection of a mounting substrate on which the duplexer is mounted, the plurality of second mounting electrodes being superposed with the plurality of first mounting electrodes when viewed in plan from a direction normal to the first main surface. The first mounting electrodes and the second mounting electrodes, which are superposed with one another when viewed in plan from a direction normal to the first main surface, are electrically connected to each other.

A duplexer according to a preferred embodiment of the present invention includes the substrate, a high-frequency-side filter component mounted on the first main surface of the substrate, and a low-frequency-side filter component mounted on the first main surface of the substrate.

A substrate module according to a preferred embodiment of the present invention includes a mounting substrate and the duplexer mounted on the mounting substrate.

According to various preferred embodiments of the present invention, isolation characteristics of a high-frequency-side signal path and a low-frequency-side signal path are significantly improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, package substrates, duplexers and substrate modules according to preferred embodiments of the present invention will be described with reference to the drawings.

Figure 1:
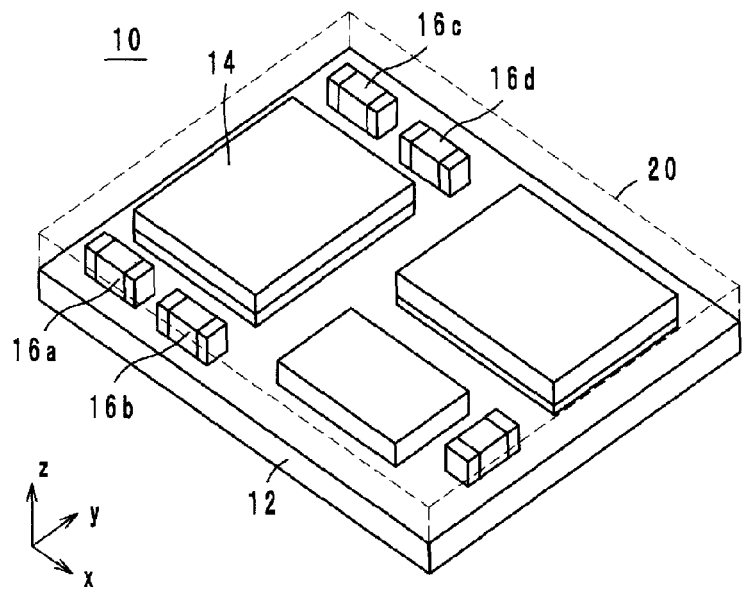
FIG. 1 is an external perspective view of a substrate module according to a preferred embodiment of the present invention.
Figure 2:
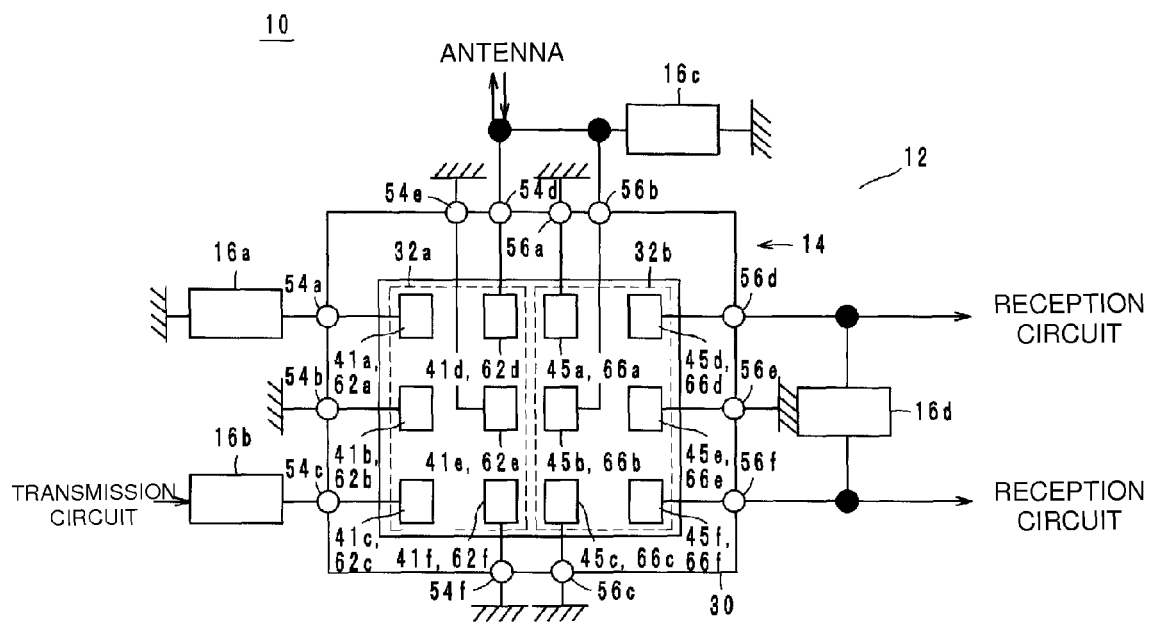
FIG. 2 illustrates a circuit configuration of the substrate module of FIG. 1.
Figure 3:
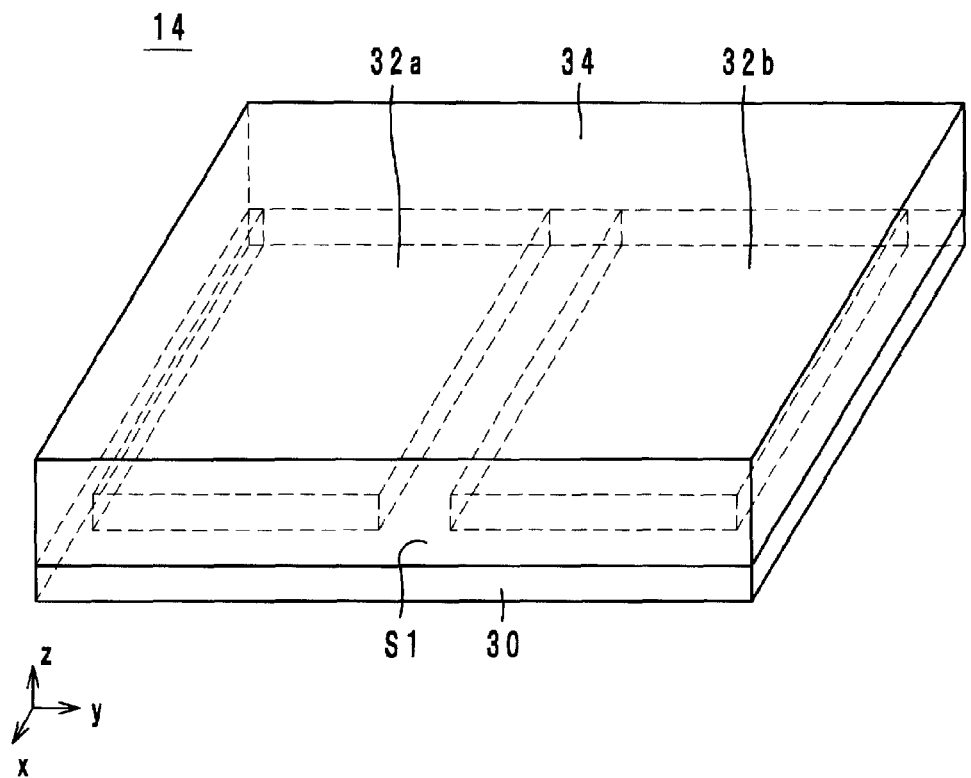
FIG. 3 is an external perspective view of a duplexer which is built into the substrate module.

Hereafter, the configuration of a substrate module according to a preferred embodiment of the present invention will be described while referring to the drawings. FIG. 1 is an external perspective view of a substrate module 10 according to a preferred embodiment of the present invention. FIG. 2 illustrates a circuit configuration of the substrate module 10 of FIG. 1. FIG. 3 is an external perspective view of a duplexer 14 which is built into the substrate module 10. Hereafter, a height direction of the substrate module 10, which preferably has a rectangular or substantially rectangular parallelepiped shape, is defined as a z-axis direction. In addition, when viewed in plan from the z-axis direction, a direction in which long sides extend is defined as an x-axis direction and a direction in which short sides extend is defined as a y-axis direction. The x axis, the y axis and the z axis are orthogonal to one another.

As illustrated in FIG. 1 and FIG. 2, the substrate module 10 includes a mounting substrate 12, the duplexer 14, matching elements 16a to 16d and sealing resin 20. As illustrated in FIG. 1, the mounting substrate 12 is a rectangular or substantially rectangular multilayer circuit board including a plurality of insulator layers stacked on top of one another and is to be mounted on a motherboard of a cellular phone. The mounting substrate 12 includes land electrodes (not illustrated) provided on a main surface thereof on the positive side in the z-axis direction, the land electrodes being used for mounting the duplexer 14 and the matching elements 16a to 16d.

The duplexer 14 is a branching circuit that outputs a reception signal, which is received by an antenna that is not illustrated and has a relatively high frequency, to a reception circuit (not illustrated) provided in the substrate module 10, and that outputs a transmission signal, which is output from a transmission circuit (not illustrated) provided in the substrate module 10 and has a relatively low frequency, to an antenna. As illustrated in FIG. 1, the duplexer 14 is mounted on a main surface of the mounting substrate 12 on the positive side in the z-axis direction and as illustrated in FIG. 3, includes a package substrate 30, SAW filters (high-frequency-side filter component and low-frequency-side filter component) 32a and 32b and sealing resin 34. The frequency of a transmission signal may instead be higher than the frequency of a reception signal.

As illustrated in FIG. 2, the SAW filter 32a is provided between a transmission circuit and an antenna and has a property of allowing a transmission signal having a relatively low frequency to pass therethrough to the antenna from the transmission circuit and not allowing a reception signal having a relatively high frequency to pass therethrough from the antenna to the transmission circuit. As illustrated in FIG. 2, the SAW filter 32b is provided between the antenna and reception circuits and has a property of allowing a reception signal having a relatively high frequency to pass therethrough to the reception circuits from the antenna and not allowing a transmission signal having a relatively low frequency to pass therethrough from the transmission circuit to the reception circuits.

Figure 4:
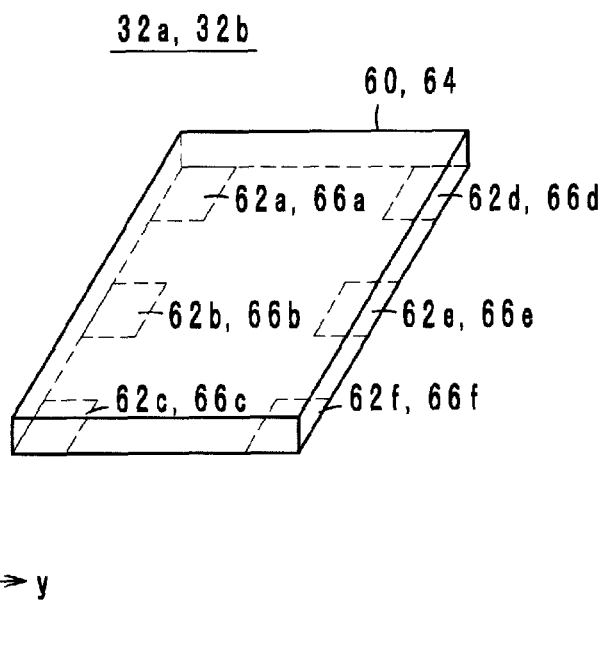
FIG. 4 is an external perspective view of a SAW filter.
Figure 5:
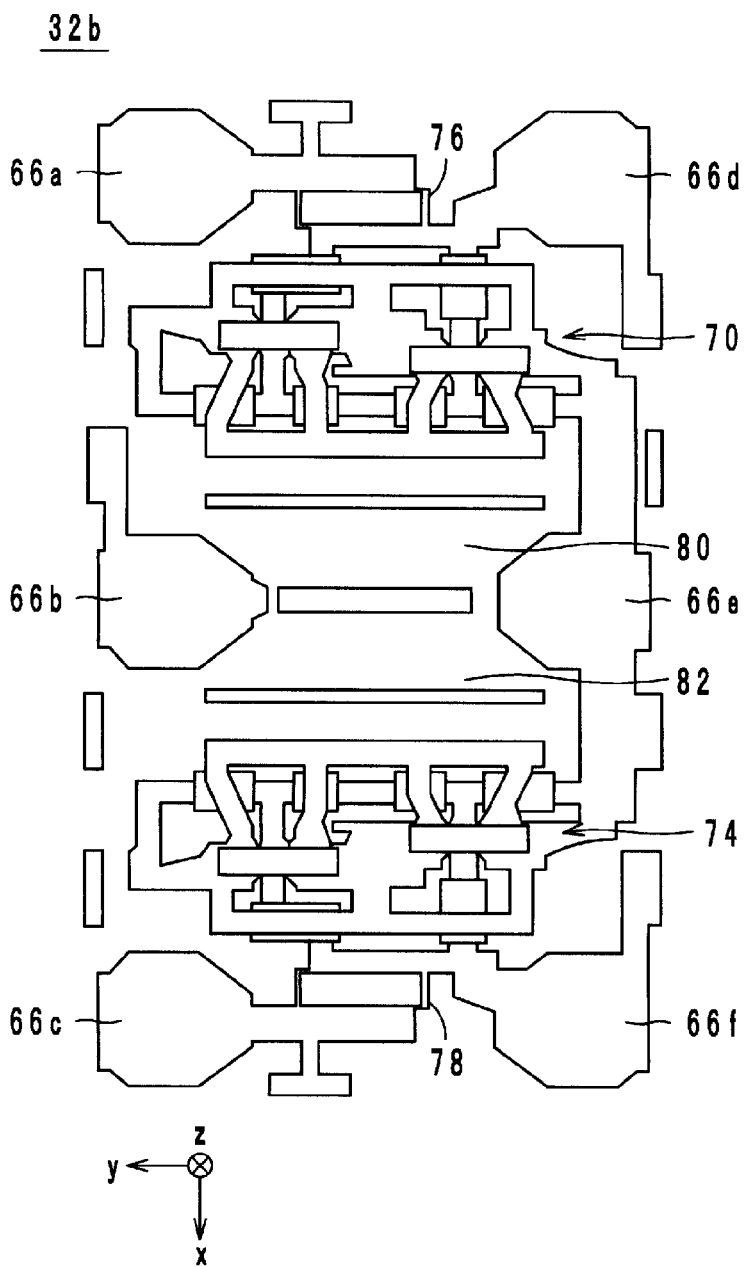
FIG. 5 illustrates an internal configuration of a SAW filter.
Figure 6:
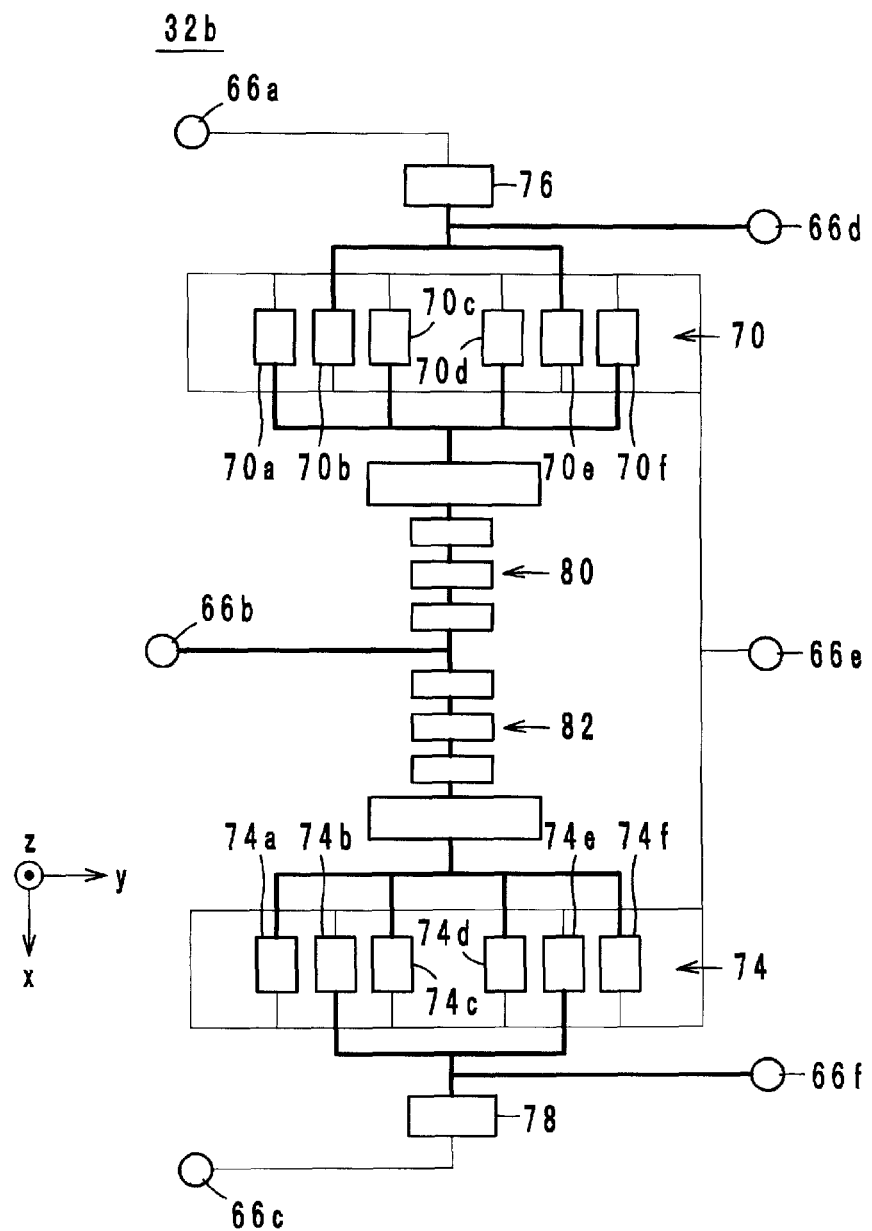
FIG. 6 is a wiring diagram of a SAW filter.

Hereafter, the configurations of the SAW filters 32a and 32b will be described with reference to the drawings. The basic configurations of the SAW filters 32a and 32b are substantially the same and therefore the SAW filter 32b will be described as an example. FIG. 4 is an external perspective view of the SAW filters 32a and 32b. FIG. 5 illustrates an internal configuration of the SAW filter 32b. FIG. 6 is a wiring diagram for the SAW filter 32b. In FIG. 6, signal lines are indicated using thick lines and ground lines are indicated using thin lines. "Signal line" means a wiring line along which a reception signal is transmitted and "ground line" means a wiring line that is maintained at a ground potential.

As illustrated in FIGS. 4 to 6, the SAW filter 32b includes a piezoelectric substrate 64, land electrodes 66 (66a to 66f), longitudinal coupling portions 70 and 74, parallel traps 76 and 78 and series traps 80 and 82. The piezoelectric substrate 64 preferably is a rectangular or substantially rectangular substrate composed of, for example, $LiTaO_3$, $LiNbO_3$ or quartz.

As illustrated in FIG. 4, the land electrodes 66 are provided on a main surface of the piezoelectric substrate 64 on the negative side in the z-axis direction. More specifically, the land electrodes 66a to 66c are provided in this order from the negative side to the positive side in the x-axis direction along an edge on the negative side in the y-axis direction. The land electrodes 66d to 66f are provided in this order from the negative side to the positive side in the x-axis direction along an edge on the positive side in the y-axis direction. As illustrated in FIG. 2, the land electrodes 66a, 66c and 66e are grounded via the mounting substrate 12 and the package substrate 30. The land electrode 66b is connected to the antenna via the package substrate 30. The land electrodes 66d and 66f are connected to the reception circuits via the package substrate 30.

As illustrated in FIG. 5 and FIG. 6, the longitudinal coupling portion 70 and the series trap 80 are connected in series with each other between the land electrodes 66d and 66b. The longitudinal coupling portion 70 includes opposing portions 70a to 70f. The opposing portions 70a, 70c, 70d and 70f are each arranged such that a ground line that is connected to the land electrode 66e and a signal line that is connected to the land electrode 66b via the series trap 80 oppose each other in the z-axis direction. The opposing portions 70b and 70e are arranged such that a signal line connected to the land electrode 66d and a ground line connected to the land electrode 66e oppose each other in the z-axis direction. The opposing portions 70a to 70f are provided in this order from the negative side to the positive side in the y-axis direction.

The series trap 80 is a resonator that is connected in series between the longitudinal coupling portion 70 and the land electrode 66b. The parallel trap 76 is a resonator that is connected in series between the land electrode 66d and the land electrode 66a.

The longitudinal coupling portion 74 and the series trap 82 are connected in series between the land electrodes 66f and 66b. The longitudinal coupling portion 74 includes opposing portions 74a to 74f. The opposing portions 74a, 74c, 74d and 74f are each arranged such that a ground line that is connected to the land electrode 66e and a signal line that is connected to the land electrode 66b via the series trap 82 oppose each other in the z-axis direction. The opposing portions 74b and 74e are arranged such that a signal line connected to the land electrode 66f and a ground line connected to the land electrode 66e oppose each other in the z-axis direction. The opposing portions 74a to 74f are provided in this order from the negative side to the positive side in the y-axis direction.

The series trap 82 is a resonator that is connected in series between the longitudinal coupling portion 74 and the land electrode 66b. The parallel trap 78 is a resonator that is connected in series between the land electrode 66f and the land electrode 66c.

In addition, as illustrated in FIG. 5 and FIG. 6, the grounded land electrodes 66a, 66c and 66e are not connected to each other with a ground line. That is, the land electrodes 66a, 66c and 66e are not electrically connected to each other in the SAW filter 32b.

Next, operation of the thus-configured SAW filter 32b will be described. When a reception signal is input from the land electrode 66b via the series trap 80, a surface acoustic wave is generated in the opposing portions 70a, 70c, 70d and 70f. The surface acoustic wave propagates along the surface of the piezoelectric substrate 64. The opposing portions 70b and 70e convert the surface acoustic wave generated in the opposing portions 70a, 70c, 70d and 70f into a reception signal. After that, the reception signal is output to outside of the SAW filter 32b via the land electrode 66d.

In addition, a reception signal input from the land electrode 66b is input to the opposing portions 74a, 74c, 74d and 74f via the series trap 82 and a surface acoustic wave is generated in the opposing portions 74a, 74c, 74d and 74f. The surface acoustic wave propagates along the surface of the piezoelectric substrate 64. The opposing portions 74b and 74e convert the surface acoustic wave generated in the opposing portions 74a, 74c, 74d and 74f into a reception signal. After that, the reception signal is output to outside of the SAW filter 32b via the land electrode 66f. The signal passing through the opposing portions 74 is 180° out of phase with a signal passing through the opposing portions 70. Thus, these signals are differential transmission signals.

Figure 7:
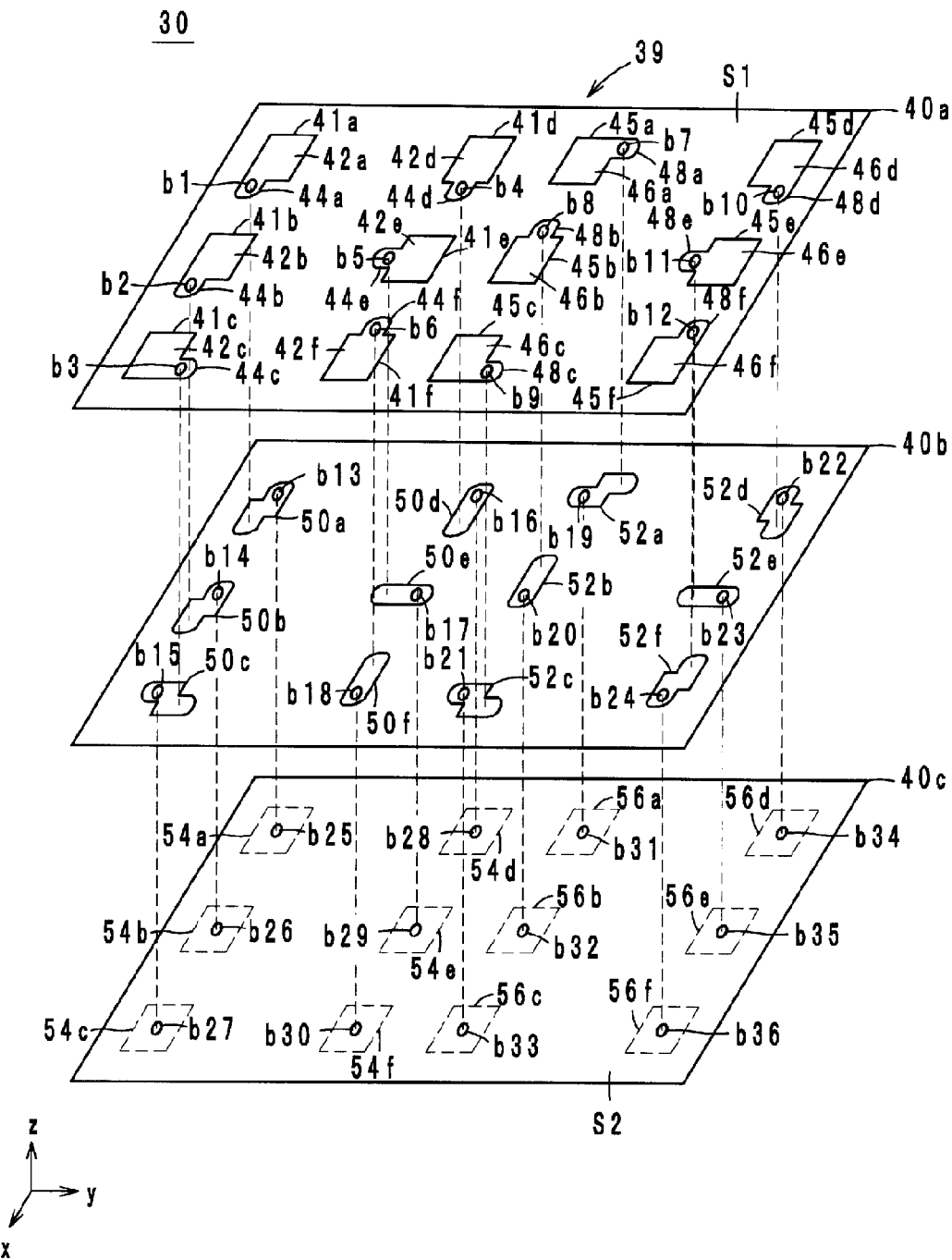
FIG. 7 is an exploded perspective view of a package substrate.

The package substrate 30 includes the SAW filters 32a and 32b mounted thereon and defines a portion of the duplexer 14. FIG. 7 is an exploded perspective view of the package substrate 30.

As illustrated in FIG. 7, the package substrate 30 includes a substrate body 39, land electrodes 41 (41a to 41f), 45 (45a to 45f), 54 (54a to 54f), 56 (56a to 56f), connection conductors 50 (50a to 50f) and 52(52a to 52f) and via hole conductors b (b1 to b36).

The substrate body 39 preferably is a rectangular or substantially rectangular multilayer wiring board including insulator layers 40a to 40c composed of alumina stacked on top of one another. As illustrated in FIG. 7, the substrate body 39 includes main surfaces S1 and S2, which oppose each other. The main surface S1 is a surface that is located on the positive side in the z-axis direction and the main surface S2 is a surface that is located on the negative side in the z-axis direction. In addition, the main surface of an insulator layer 40 on the positive side in the z-axis direction will be referred to as a front surface and the main surface of an insulator layer 40 on the negative side in the z-axis direction will be referred to as a back surface.

As illustrated in FIG. 7, the land electrodes 41 (41a to 41f) are provided on the main surface S1 (that is on the front surface of the insulator layer 40a) and are used for connection of the SAW filter 32a. More specifically, the land electrodes 41a to 41c are provided in this order from the negative side to the positive side in the x-axis direction along an edge of the main surface S1 on the negative side in the y-axis direction. The land electrodes 41d to 41f are provided in this order from the negative side to the positive side in the x-axis direction along a straight line positioned between the two edges of the main surface S1 in the y-axis direction.

In addition, as illustrated in FIG. 7, the land electrodes 41 (41a to 41f) include mounting portions 42 (42a to 42f) and connection portions 44 (44a to 44f). The mounting portions 42 have a rectangular or substantially rectangular shape and are used for connection of the SAW filter 32a. The mounting portions 42a to 42f are respectively connected to the land electrodes 62a to 62f (refer to FIG. 2 and FIG. 4) with, for example, solder. The connection portions 44 are projections that project from any of the four edges of the mounting portions 42. The via hole conductors b, which will be described later, are connected to the connection portions 44.

As illustrated in FIG. 7, the land electrodes 54 (54a to 54f) are provided on the main surface S2 (that is, on the back surface of the insulator layer 40c) and are rectangular or substantially rectangular electrodes used for connection of the mounting substrate 12. That is, the land electrodes 54 are connected using solder or the like to land electrodes (not illustrated) provided on a main surface of the mounting substrate 12 on the positive side in the z-axis direction. Specifically, as illustrated in FIG. 2, the land electrodes 54a, 54b, 54e and 54f are grounded via the land electrodes of the mounting substrate 12. As illustrated in FIG. 2, the land electrode 54c is connected to the transmission circuit via a land electrode of the mounting substrate 12. As illustrated in FIG. 2, the land electrode 54d is connected to the antenna via a land electrode of the mounting substrate 12.

The land electrodes 54a to 54c are provided in this order from the negative side to the positive side in the x-axis direction along an edge of the main surface S2 on the negative side in the y-axis direction. The land electrodes 54d to 54f are provided in this order from the negative side to the positive side in the x-axis direction along a straight line positioned between the two edges of the main surface S2 in the y-axis direction.

In addition, the land electrodes 54a to 54f are respectively superposed with the land electrodes 41a to 41f when viewed in plan from the z-axis direction (that is, a direction normal to the main surface S1). In this preferred embodiment, the land electrodes 54a to 54f are respectively superposed with the mounting portions 42a to 42f when viewed in plan from a direction normal to the main surface S1.

In addition, the land electrodes 41a to 41f and the land electrodes 54a to 54f, which are superposed with each other when viewed in plan from a direction normal to the main surface S1, are electrically connected to each other. Next, connection of the land electrodes 41 and 54 will be described.

The via hole conductors b1 to b6 extend in the z-axis direction so as to penetrate through the insulator layer 40a. The via hole conductors b1 to b6 are respectively connected to the connection portions 44a to 44f (land electrodes 41a to 41f).

The via hole conductors b13 to b18 extend in the z-axis direction so as to penetrate through the insulator layer 40b. The via hole conductors b25 to b30 extend in the z-axis direction so as to penetrate through the insulator layer 40c. The via hole conductors b13 and b25 are connected in series with each other and thus define a single via hole conductor. The via hole conductors b14 and b26 are connected in series with each other and thus define a single via hole conductor. The via hole conductors b15 and b27 are connected in series with each other and thus define a single via hole conductor. The via hole conductors b16 and b28 are connected in series with each other and thus define a single via hole conductor. The via hole conductors b17 and b29 are connected in series with each other and thus define a single via hole conductor.

The via hole conductors b18 and b30 are connected in series with each other and thus define a single via hole conductor. The via hole conductors b25 to b30 are respectively connected to the land electrodes 54a to 54f.

The connection conductors 50 (50a to 50f) are provided on the front surface of the insulator layer 40b. That is, the connection conductors 50 are built into the substrate body 39. One end of each of the connection conductors 50 is superposed with a corresponding one of the connection portions 44 when viewed in plan from the z-axis direction. The other end of each of the connection conductors 50 is superposed with a corresponding one of the land electrodes 54 when viewed in plan from the z-axis direction. Thus, the connection conductors 50a to 50f respectively provide connections between the via hole conductors b1 to b6 and the via hole conductors b13 to b18. Therefore, the land electrodes 41a to 41f and the land electrodes 54a to 54f, which are superposed with each other when viewed in plan from a direction normal to the main surface S1, are electrically connected to each other.

As illustrated in FIG. 7, the land electrodes 45 (45a to 45f) are provided on the main surface S1 (that is, on the front surface of the insulator layer 40a) and are used for connection of the SAW filter 32b. More specifically, the land electrodes 45a to 45c are provided in this order from the negative side to the positive side in the x-axis direction along a straight line positioned between the two edges of the main surface S1 in the y-axis direction. The land electrodes 45d to 45f are provided in this order from the negative side to the positive side in the x-axis direction along an edge of the main surface S1 on the positive side in the y-axis direction.

In addition, as illustrated in FIG. 7, the land electrodes 45 (45a to 45f) include mounting portions 46 (46a to 46f) and connection portions 48 (48a to 48f). The mounting portions 46 have a rectangular or substantially rectangular shape and are used for connection of the SAW filter 32b. The mounting portions 46a to 46f are respectively connected by solder or the like to the land electrodes 66a to 66f (refer to FIG. 2 and FIG. 4). The connection portions 48 are projections that project from any of the four edges of the mounting portions 46. Via hole conductors b, which will be described later, are connected to the connection portions 48.

As illustrated in FIG. 7, the land electrodes 56 (56a to 56f) are provided on the main surface S2 (that is, on the back surface of the insulator layer 40c) and are rectangular or substantially rectangular electrodes used for connection of the mounting substrate 12. That is, the land electrodes 56 are connected using solder or the like to land electrodes (not illustrated) provided on a main surface of the mounting substrate 12 on the positive side in the z-axis direction. Specifically, as illustrated in FIG. 2, the land electrodes 56a, 56c and 56e are grounded via the land electrodes of the mounting substrate 12. As illustrated in FIG. 2, the land electrode 56b is connected to the antenna via a land electrode of the mounting substrate 12. As illustrated in FIG. 2, the land electrode 56d is connected to a first reception circuit via a land electrode of the mounting substrate 12. As illustrated in FIG. 2, the land electrode 56f is connected to a second reception circuit via a land electrode of the mounting substrate 12.

The land electrodes 56a to 56c are provided in this order from the negative side to the positive side in the x-axis direction along a straight line positioned between the two edges of the main surface S2 in the y-axis direction. The land electrodes 56d to 56f are provided in this order from the negative side to the positive side in the x-axis direction along an edge of the main surface S2 on the positive side in the y-axis direction.

In addition, the land electrodes 56a to 56f are respectively superposed with the land electrodes 45a to 45f when viewed in plan from the z-axis direction (that is, a direction normal to the main surface S1). In this preferred embodiment, the land electrodes 56a to 56f are respectively superposed with the mounting portions 46a to 46f when viewed in plan from a direction normal to the main surface S1.

In addition, the land electrodes 45a to 45f and the land electrodes 56a to 56f, which are superposed with each other when viewed in plan from a direction normal to the main surface S1, are electrically connected to each other. Next, connection of the land electrodes 45 and 56 will be described.

The via hole conductors b7 to b12 extend in the z-axis direction so as to penetrate through the insulator layer 40a. The via hole conductors b7 to b12 are respectively connected to the connection portions 48a to 48f (land electrodes 45a to 45f).

The via hole conductors b19 to b24 extend in the z-axis direction so as to penetrate through the insulator layer 40b. The via hole conductors b31 to b36 extend in the z-axis direction so as to penetrate through the insulator layer 40c. The via hole conductors b19 and b31 are connected in series with each other and to define a single via hole conductor. The via hole conductors b20 and b32 are connected in series with each other and thus define a single via hole conductor. The via hole conductors b21 and b33 are connected in series with each other and thus define a single via hole conductor. The via hole conductors b22 and b34 are connected in series with each other and thus define a single via hole conductor. The via hole conductors b23 and b35 are connected in series with each other and thus define a single via hole conductor. The via hole conductors b24 and b36 are connected in series with each other and thus define a single via hole conductor. The via hole conductors b31 to b36 are respectively connected to the land electrodes 56a to 56f.

The connection conductors 52 (52a to 52f) are provided on the front surface of the insulator layer 40b. That is, the connection conductors 52 are built into the substrate body 39. One end of each of the connection conductors 52 is superposed with a corresponding one of the connection portions 48 when viewed in plan from the z-axis direction. The other end of each of the connection conductors 52 is superposed with a corresponding one of the land electrodes 56 when viewed in plan from the z-axis direction. Thus, the connection conductors 52a to 52f respectively provide connections between the via hole conductors b7 to b12 and the via hole conductors b19 to b24. Therefore, the land electrodes 45a to 45f and the land electrodes 56a to 56f, which are superposed with each other when viewed in plan from a direction normal to the main surface S1, are electrically connected to each other.

Here, the land electrodes 41a to 41f and 45a to 45f are not electrically connected to each other in the substrate body 39. In addition, the land electrodes 54a to 54f and 56a to 56f are not electrically connected to each other in the substrate body 39.

The sealing resin 34 is for example formed of an epoxy resin and, as illustrated in FIG. 3, is provided so as to cover the main surface S1 of the package substrate 30 and the SAW filters 32a and 32b. Thus, the SAW filters 32a and 32b are protected by the sealing resin 34.

As illustrated in FIG. 1, the matching elements 16a to 16d are mounted on the main surface of the mounting substrate 12 on the positive side in the z-axis direction and are electronic chip components for realizing impedance matching between the mounting substrate 12 and the duplexer 14. The matching elements 16a, 16b and 16c, as illustrated in FIG. 2, are coils that are connected in series between the land electrodes 54a, 54c and 56b and the ground. The matching element 16d is a coil connected between a signal line, which connects the land electrode 56d and the first reception circuit to each other, and a signal line, which connects the land electrode 56f and the second reception circuit to each other.

The sealing resin 20 is provided so as to cover the main surface of the mounting substrate 12 on the positive side in the z-axis direction, the duplexer 14 and the matching elements 16a to 16d. Thus, the duplexer 14 and the matching elements 16a to 16d are protected.

Next, operation of the thus-configured substrate module 10 will be described. In the case where a transmission signal is to be transmitted from a wireless communication device in which the substrate module 10 is mounted, the transmission circuit generates a transmission signal. The transmission signal passes through the duplexer 14 and is transmitted to the antenna. Here, the SAW filter 32a of the duplexer 14 has a characteristic of allowing a transmission signal to pass therethrough between the land electrode 62c and the land electrode 62d and not allowing a reception signal to pass therethrough between the land electrode 62c and the land electrode 62d. Therefore, even when a reception signal received by the antenna is input to the SAW filter 32a from the land electrode 62d, the reception signal cannot be output from the land electrode 62c. Therefore, entry of a reception signal into the transmission circuit is prevented.

In addition, in the case where the wireless communication device in which the substrate module 10 is mounted receives a reception signal, the antenna receives a reception signal. The reception signal passes through the duplexer 14 and is transmitted to a reception circuit. Here, the SAW filter 32b of the duplexer 14 has a characteristic of separating a reception signal input from the land electrode 66b into signals of opposite phases and outputting these signals from the land electrode 66d and the land electrode 66f. Therefore, even if a transmission signal generated by the transmission circuit is input to the SAW filter 32b from the land electrode 66b, the transmission signal cannot be output from the land electrode 62d. Similarly, even if a reception signal received by the antenna is input to the SAW filter 32b from the land electrode 66b, the reception signal cannot be output from the land electrodes 62d and 66f. Therefore, entry of a transmission signal into a reception circuit is prevented.

(Effects)

With the above-described package substrate 30, duplexer 14 and substrate module 10, the isolation characteristics of the signal path of a transmission signal and the signal path of a reception signal in the duplexer 14 can be improved. In more detail, in the branching filter described in Japanese Unexamined Patent Application Publication No. 2009-290606, inductor patterns for matching the transmission surface acoustic wave filter and the reception surface acoustic wave filter are built into the circuit board. As a result, when wiring lines such as inductor patterns are provided inside the circuit board, a transmission signal path and a reception signal path are close to each other and liable to become electromagnetically coupled. As a result, there is a risk of a transmission high frequency signal entering the reception signal path and thus the isolation characteristics of transmission and reception being degraded.

Accordingly, in the package substrate 30, the land electrodes 41a to 41f and 45a to 45f and the land electrodes 54a to 54f and 56a to 56f, which are superposed with each other when viewed in plan from a direction normal to the main surface S1 are electrically connected to each other. Thus, there is no need to provide comparatively long wiring lines inside the package substrate 30 in order to connect the land electrodes 41a to 41f and 45a to 45f and the land electrodes 54a to 54f and 56a to 56f. Therefore, in the package substrate 30, the signal path of a transmission signal and the signal path of the reception signal are not close to each other and do not cross each other. As a result, electromagnetic coupling of the signal path of a transmission signal and the signal path of a reception signal is significantly reduced or prevented and degradation of isolation characteristics of transmission and reception is significantly reduced or prevented.

In addition, with the package substrate 30, the duplexer 14 and the substrate module 10, the isolation characteristics of the signal path of a transmission signal and the signal path of a reception signal in the duplexer 14 can also be improved for the following reason. In more detail, in the package substrate 30, the land electrodes 41a to 41f and 45a to 45f are not electrically connected to each other in the substrate body 39. In addition, the land electrodes 54a to 54f and 56a to 56f are not electrically connected to each other in the substrate body 39. That is, the grounded land electrodes 41a, 41b, 41e, 41f, 45a, 45c and 45e are not electrically connected to each other in the substrate body 39. The grounded land electrodes 54a, 54b, 54e, 54f, 56a, 56c and 56e are not electrically connected to each other in the substrate body 39. Thus, for example, even if a transmission signal enters the package substrate 30 via the grounded land electrode 45a, the transmission signal is not transmitted to the grounded land electrodes 41a, 41b, 41e, 41f, 45c and 45e. Accordingly, entry of a transmission signal into the land electrodes 45d and 45f connected to the reception circuits via the land electrodes 41a, 41b, 41e, 41f, 45c and 45e is prevented. As a result, with the duplexer 14 and the substrate module 10, the isolation characteristics of the signal path of a transmission signal and the signal path of a reception signal in the duplexer 14 can be improved.

In addition, with the package substrate 30, the duplexer 14 and the substrate module 10, the isolation characteristics of the signal path of a transmission signal and the signal path of a reception signal in the duplexer 14 can be improved for the following reason. In more detail, in the package substrate 30, the land electrodes 41a to 41f and 45a to 45f are not electrically connected to each other in the substrate body 39. In addition, the land electrodes 54a to 54f and 56a to 56f are not electrically connected to each other in the substrate body 39. Accordingly, in the case where connection is necessary between the land electrodes 54a to 54f and 56a to 56f, such connection is made inside the mounting substrate 12. The mounting substrate 12 is larger than the package substrate 30 and therefore wiring lines for connection can be arranged thereinside so as to be spaced apart from each other. As a result, the signal path of a transmission signal and the signal path of a reception signal can be prevented from being close to each other and the isolation characteristics of the signal path of a transmission signal and the signal path of a reception signal can be improved.

In addition, with the package substrate 30, the duplexer 14 and the substrate module 10, the isolation characteristics of the signal path of a transmission signal and the signal path of a reception signal in the duplexer 14 can be improved for the following reason. In more detail, the connection conductors 50a to 50f respectively provide connections between the via hole conductors b1 to b6 and the via hole conductors b13 to b18. In addition, the connection conductors 52a to 52f respectively provide connections between the via hole conductors b7 to b12 and the via hole conductors b19 to b24. Therefore, the distance between the signal path of a transmission signal and the signal path of a reception signal in the package substrate 30 can be made large by the connection conductors 50 and 52. Therefore, with the above-described package substrate 30, duplexer 14 and substrate module 10, the isolation characteristics of the signal path of a transmission signal and the signal path of a reception signal in the duplexer 14 can be improved.

In addition, in the package substrate 30, the via hole conductors b1 to b12, the via hole conductors b13 to b36 and the connection conductors 50a to 50f and 52a to 52f are provided so as to correspond to the land electrodes 41a to 41f and 45a to 45f and the land electrodes 54a to 54f and 56a to 56f. The connection conductors 50a to 50f and 52a to 52f are not electrically connected to each other in the substrate body 39. Therefore, with the above-described package substrate 30, duplexer 14 and substrate module 10, the isolation characteristics of the signal path of a transmission signal and the signal path of a reception signal in the duplexer 14 can be improved.

In addition, with the package substrate 30, the duplexer 14 and the substrate module 10, the degree of freedom in designing the signal path of a transmission signal and the signal path of a reception signal inside the duplexer 14 is increased. Accordingly, in the case where connection is necessary between the land electrodes 54a to 54f and 56a to 56f, such connection is made inside the mounting substrate 12. The mounting substrate 12 is larger than the package substrate 30 and therefore the wiring lines for connection can be designed with a high degree of freedom.

In the package substrate 30, the duplexer 14 and the substrate module 10, the occurrence of connection defects between the package substrate 30 and the SAW filters 32a and 32b is significantly reduced or prevented. In more detail, the via hole conductors b are formed preferably by forming via holes in the insulator layer 40a and then filling the via holes with a conductor, for example. Consequently, unevenness is liable to occur in portions of the main surface S1 where the via hole conductors b are provided. When the SAW filters 32a and 32b and the package substrate 30 are connected to each other, there is a risk of connection defects occurring therebetween at the portions where such unevenness occurs. Accordingly, in the package substrate 30, as illustrated in FIG. 7, the land electrodes 41 and 45 include the mounting portions 42 and 46 and the connection portions 44 and 48. The mounting portions 42 and 46 are used for connection of the SAW filters 32a and 32b. In addition, the via hole conductors b are connected to the connection portions 44 and 48. That is, in the land electrodes 41 and 45, a portion to which the SAW filters 32a and 32b are connected and a portion to which the via holes b are connected are separately provided. Since the via hole conductors b are not connected to the mounting portions 42 and 46, which are used in connecting the SAW filters 32a and 32b, it is unlikely that unevenness will occur. Therefore, in the package substrate 30, the duplexer 14 and the substrate module 10, the occurrence of connection defects between the package substrate 30 and the SAW filters 32a and 32b is significantly reduced or prevented.

The inventors of the present application carried out the following computer simulation in order to further clarify and confirm the advantageous effects exhibited by the package substrate 30, the duplexer 14 and the substrate module 10. In more detail, the inventors of the present application, created the substrate module 10 illustrated in FIG. 2 as a first model and created a substrate module described below as a second model. The isolation characteristics of a signal path of a transmission signal and a signal path of a reception signal were calculated for the first model and the second model.

Figure 8:
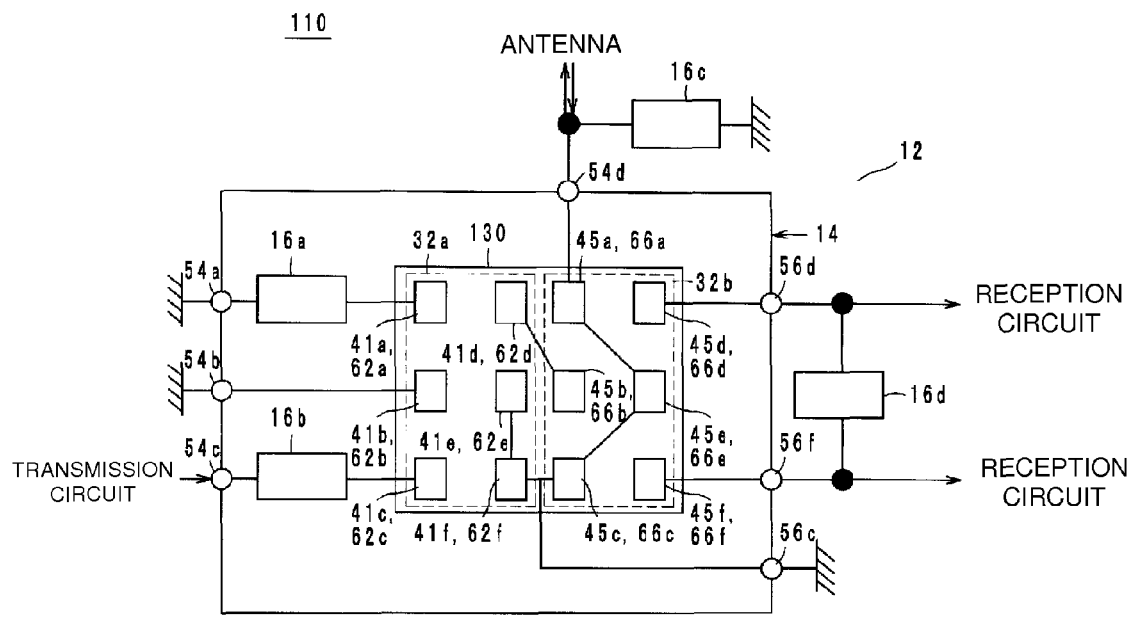
FIG. 8 illustrates a circuit configuration of a substrate module corresponding to a second model.

First, the second model will be described while referring to the drawings. FIG. 8 illustrates a circuit configuration of a substrate module 110 corresponding to the second model. In FIG. 8, structures the same as those in FIG. 2 are denoted by the same reference symbols.

In the substrate module 110, land electrodes 41d and 45b are connected to each other. In addition, the land electrodes 41e, 41f, 45a, 45c and 45e are connected to each other. In addition, although not illustrated, coil wiring that realizes impedance matching for the mounting substrate 12 and the duplexer 14 is provided inside a package substrate 130.

Figure 9A:
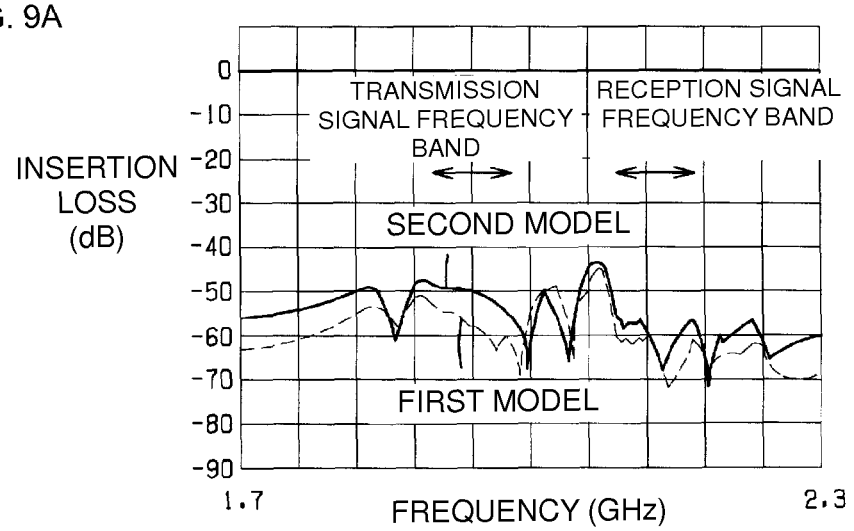
FIGS. 9A and 9B are graphs representing the results of a computer simulation.
Figure 9B:
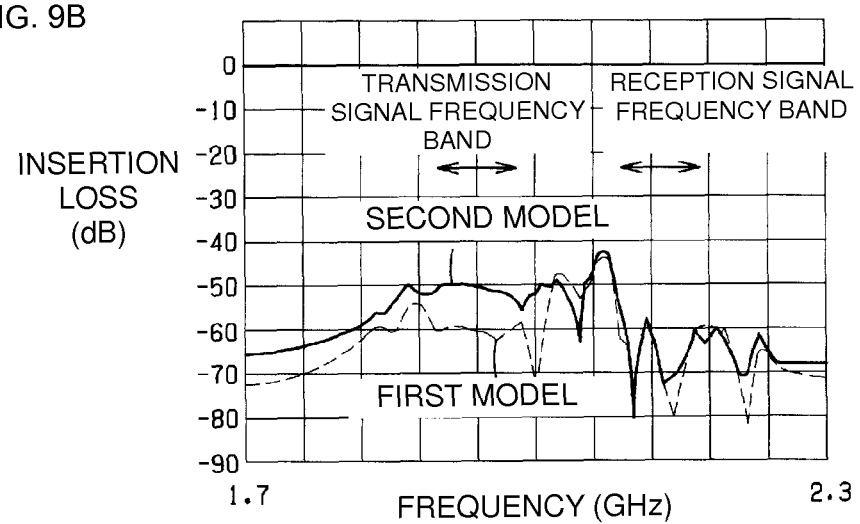

FIGS. 9A and 9B are graphs illustrating the results of the computer simulation. FIG. 9A is a graph illustrating the relationship between insertion loss of the land electrode 56f from the land electrode 54c and frequency. FIG. 9B is a graph illustrating the relationship between insertion loss of the land electrode 56d from the land electrode 54c and frequency.

As illustrated in FIG. 9A and FIG. 9B, in the frequency band of a transmission signal, it is clear that the insertion loss is greater in the first model than in the second model. Therefore, it is clear that it is less likely that a transmission signal will enter a reception circuit in the first model than in the second model. That is, it is clear that the isolation characteristics of transmission and reception are more excellent in the first model than in the second model.

Figure 10:
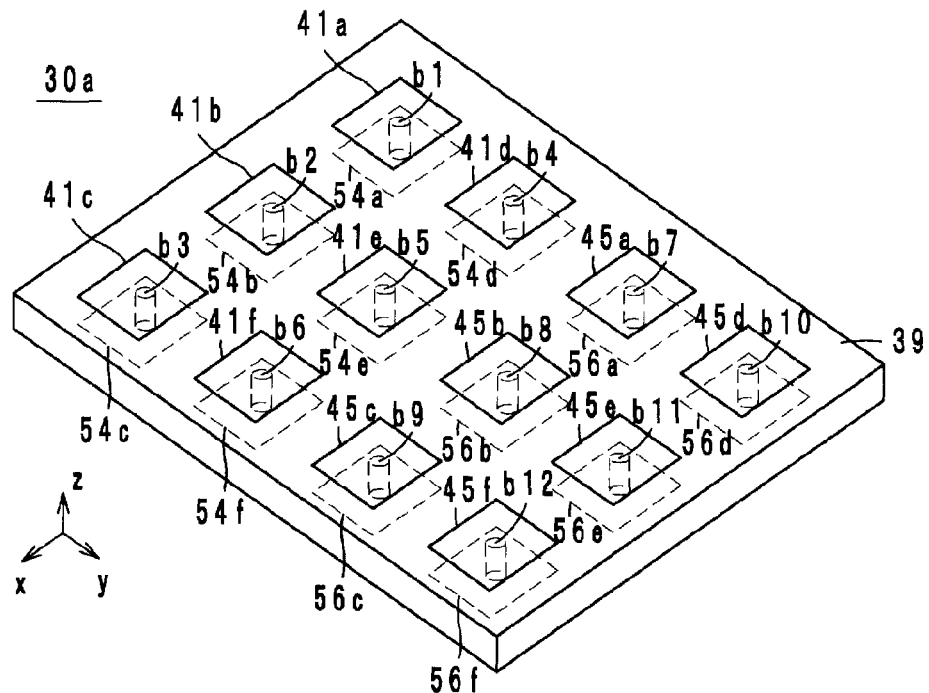
FIG. 10 is a transparent view of a package substrate according to a first modification of a preferred embodiment of the present invention.

Next, a package substrate according to a first modification of a preferred embodiment of the present invention will be described with reference to the drawings. FIG. 10 is a transparent view of a package substrate 30a according to a first modification of a preferred embodiment of the present invention.

The package substrate 30 and the package substrate 30a differ from each other in terms of the presence or absence of the connection conductors 50 and 52. In more detail, in the package substrate 30a, the land electrodes 41 and 45 and the land electrodes 54 and 56 are respectively connected to each other through via hole conductors b1 to b12, which extend in the z-axis direction. In the package substrate 30a, the connection conductors 50 and 52 are not provided and therefore the substrate body 39 can be made into a monolayer structure, and the cost of manufacturing the substrate and the profile of the substrate module can be reduced. In addition, since the substrate body 39 consists of a single layer, waving and warping of the package substrate 30a can be significantly reduced or prevented. As a result, the cost of manufacturing the package substrate 30a can be significantly reduced.

In the package substrate 30a, the land electrodes 41 and 45 and the land electrodes 54 and 56 are respectively connected to one another by single via hole conductors. However, the land electrodes 41 and 45 and the land electrodes 54 and 56 may be respectively connected to one another by pluralities of via hole conductors b. In addition, it is not necessary that all of the land electrodes 41 and 45 and the land electrodes 54 and 56 be connected to one another by pluralities of via hole conductors b and just some of the land electrodes 41 and 45 and the land electrodes 54 and 56 may be connected to one another by pluralities of via hole conductors b.

In addition, the land electrodes 41 and 45 in the package substrate 30a preferably have a rectangular or substantially rectangular shape, but, as illustrated in FIG. 7, the land electrodes 41 and 45 may include the mounting portions 42 and 46 and the connection portions 44 and 48.

Figure 11:
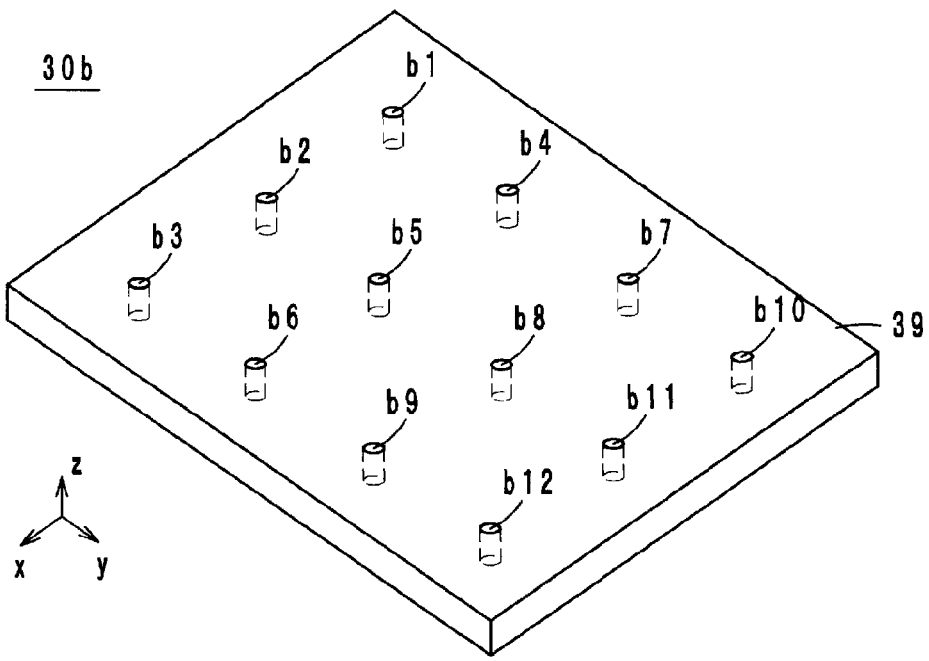
FIG. 11 is a transparent view of a package substrate according to a second modification of a preferred embodiment of the present invention.

Next, a package substrate according to a second modification of a preferred embodiment of the present invention will be described with reference to the drawings. FIG. 11 is a transparent view of a package substrate 30b according to a second modification of a preferred embodiment of the present invention.

The package substrate 30b and the package substrate 30a differ from each other in terms of the presence or absence of the land electrodes 41, 45, 54 and 56. In more detail, in the package substrate 30b, the land electrodes 41, 45, 54 and 56 are not provided. Therefore, the end surfaces of the via hole conductors b1 to b12 on the positive side in the z-axis direction function as mounting electrodes for connection of the SAW filters 32a and 32b and the end surfaces of the via hole conductors b1 to b12 on the negative side in the z-axis direction function as mounting electrodes for connection of the mounting substrate 12. That is, the land electrodes 62 and 66 of the SAW filters 32a and 32b are directly connected to the end surfaces of the via hole conductors b1 to b12 on the positive side in the z-axis direction. In addition, the land electrodes of the mounting substrate 12 are directly connected to the end surfaces of the via hole conductors b1 to b12 on the negative side in the z-axis direction.

With the package substrate 30b, since the land electrodes 41, 45, 54 and 56 are not provided, the number of manufacturing steps can be reduced.

In addition, the end surfaces of the via hole conductors b1 to b12 are smaller than the land electrodes 41, 45, 54 and 56. Therefore, even if the via hole conductors b1 to b12 are close to each other, shorts are unlikely to occur between the via hole conductors b1 to b12. Therefore, with the package substrate 30b, even in the case where the pitch of the land electrodes 62 and 66 of the SAW filters 32a and 32b and the pitch of the land electrodes of the mounting substrate 12 are narrow, the package substrate 30b, the SAW filters 32a and 32b and the mounting substrate 12 can be connected to each other.

Figure 12:
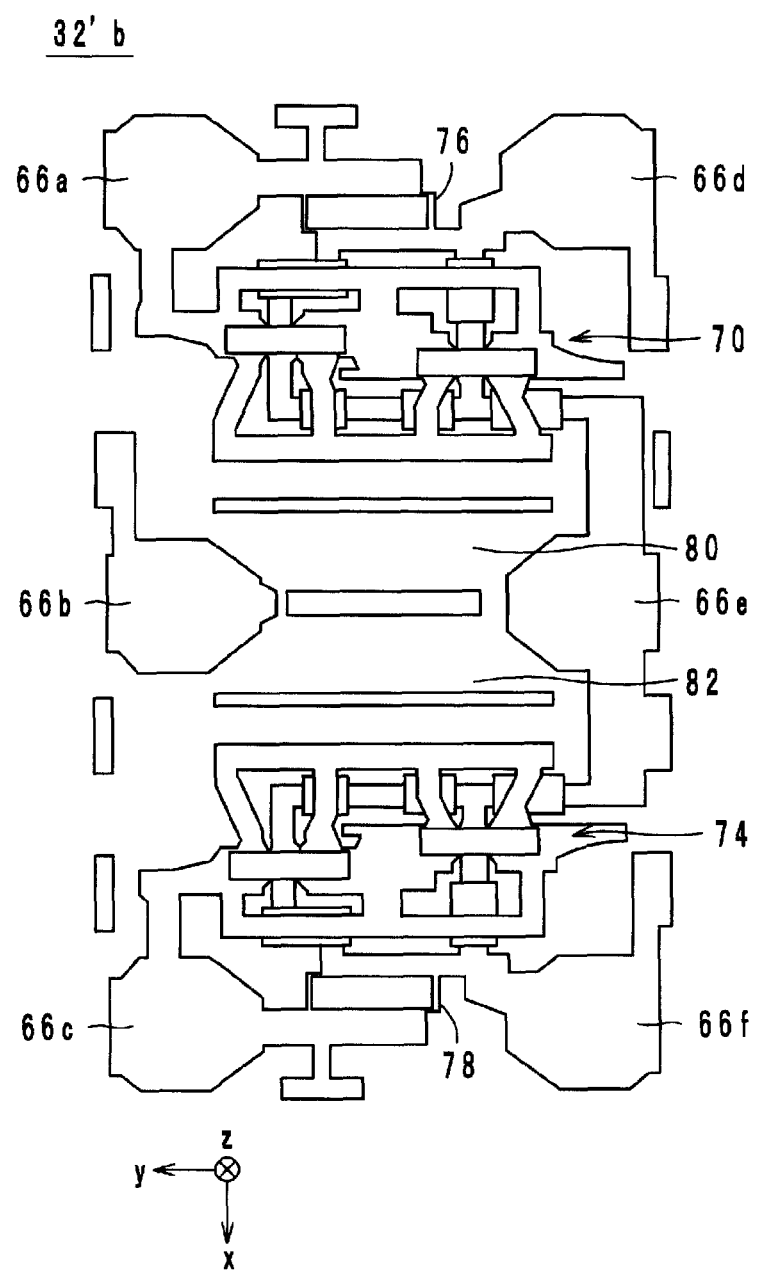
FIG. 12 illustrates an internal configuration of a SAW filter.
Figure 13:
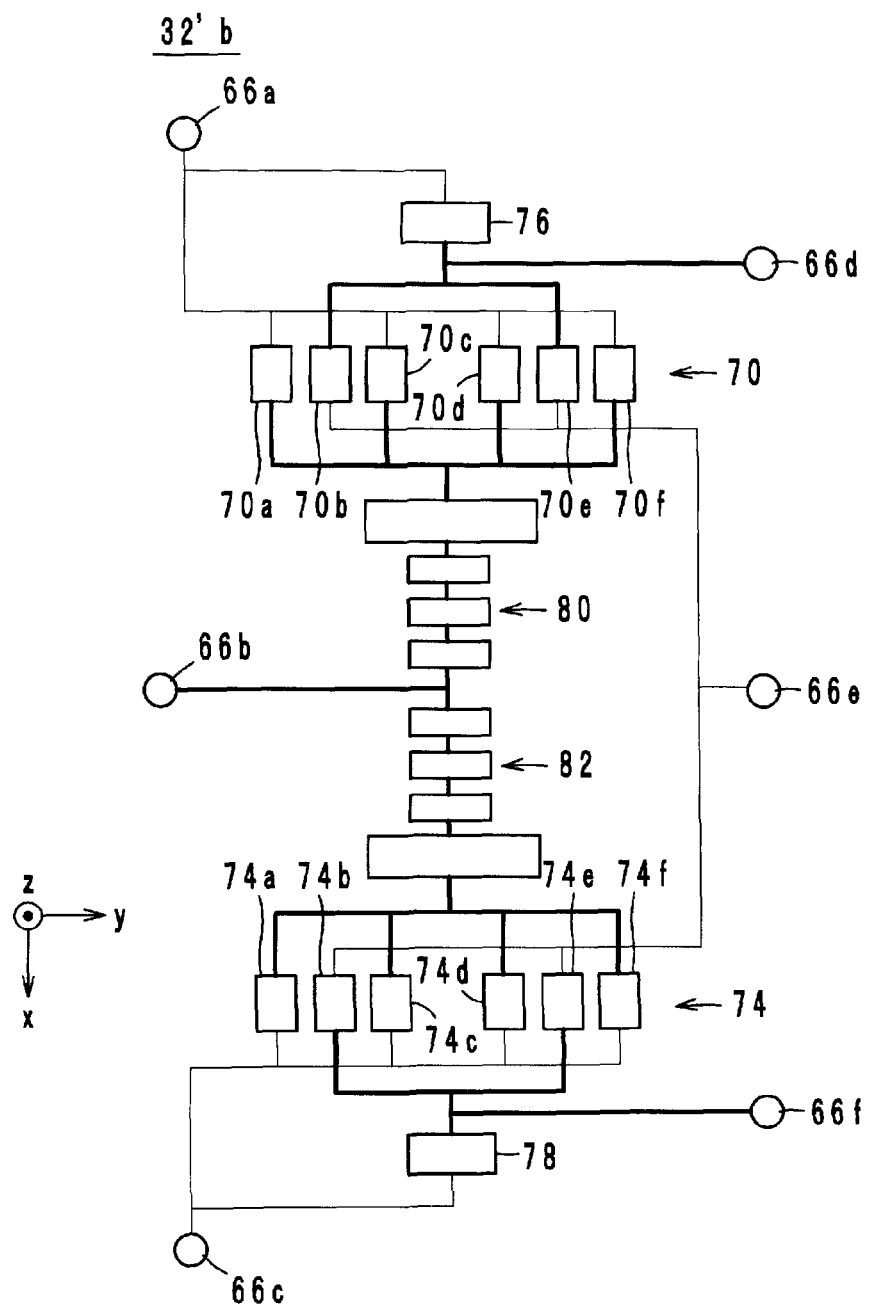
FIG. 13 is a wiring diagram of a SAW filter.

Next, SAW filters 32'a and 32'b according to a modification of a preferred embodiment of the present invention will be described with reference to the drawings. Hereafter, description will be given taking the SAW filter 32'b as an example. FIG. 12 illustrates an internal configuration of the SAW filter 32'b. FIG. 13 is a wiring diagram for the SAW filter 32'b.

The SAW filter 32b and the SAW filter 32'b differ from each other in that some of the ground lines have been removed from the SAW filter 32'b. In more detail, as illustrated in FIG. 12 and FIG. 13, the ground line connecting the opposing portions 70a and 70b, the ground line connecting the opposing portions 70e and 70f, the ground line connecting the opposing portions 74a and 74b and the ground line connecting the opposing portions 74e and 74f have been removed. Thus, the generation of stray capacitances and parasitic inductances can be reduced and the isolation characteristics can be improved.

Figure 14A:
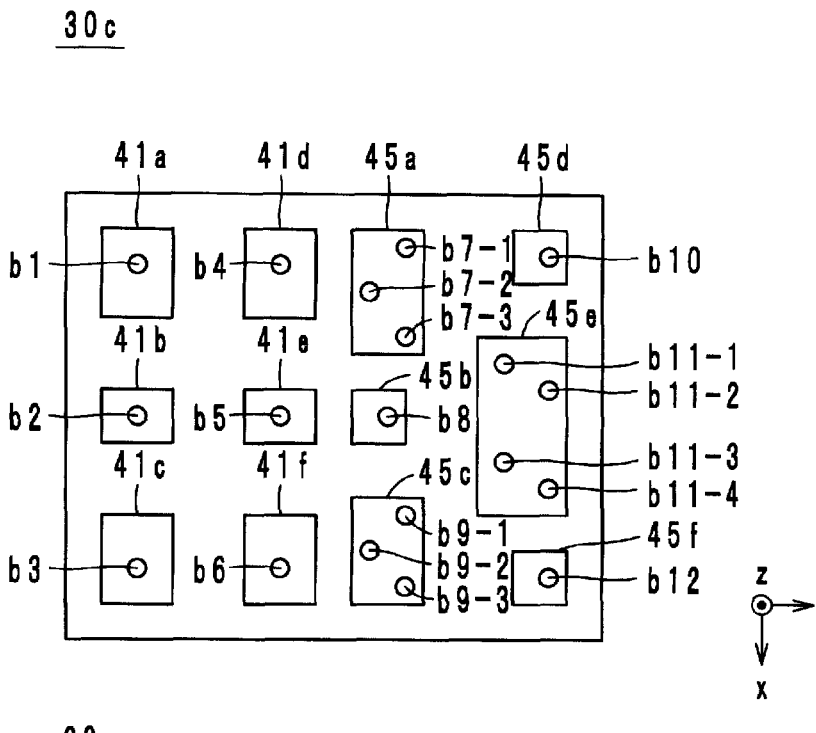
FIGS. 14A and 14B are plan views of a package substrate according to a third modification of a preferred embodiment of the present invention.
Figure 14B:
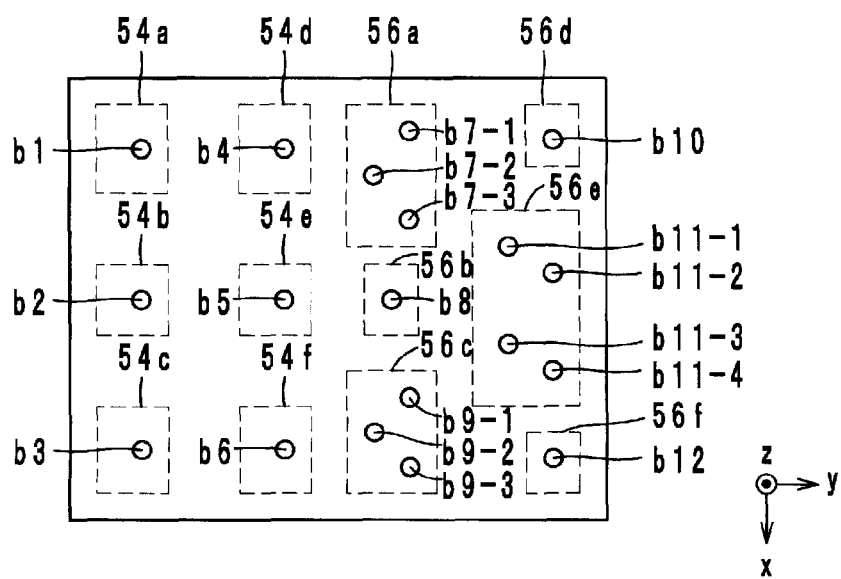

Next, a package substrate according to a third modification of a preferred embodiment of the present invention will be described with reference to the drawings. FIGS. 14A and 14B are plan views of a package substrate 30c according to the third modification.

The package substrate 30c and the package substrate 30a differ from each other in terms of the sizes of the land electrodes 41 and 45. In more detail, in the package substrate 30c, the sizes of the land electrodes 41 and 45 are not uniform. The areas of the land electrodes 45a, 45c and 45e, which are connected to the land electrodes 66a, 66c and 66e are larger than the areas of the land electrodes 45b, 45d, 45f that are not connected to the land electrodes 66a, 66c and 66e among the land electrodes 66a to 66f used when mounting the SAW filter component 32b.

In addition, the areas of the land electrodes 56a, 56c and 56e, which are connected to the land electrodes 45a, 45c and 45e connected to the land electrodes 66a, 66c and 66e, are larger than the areas of the land electrodes 56b, 56d and 56f, which are connected to the land electrodes 45b, 45d and 45f not connected to the land electrodes 66a, 66c and 66e among the land electrodes 66a to 66f used when mounting the SAW filter component 32b.

As described above, the areas of the land electrodes 45a, 45c and 45e, which are held at the ground potential, are made to be larger than the areas of the other land electrodes 45b, 45d and 45f, such that entry of a transmission signal from the land electrodes 41a, 41c and 41f side into the land electrodes 45b, 45d and 45f is prevented. As a result, the isolation characteristics of the signal path of a transmission signal and the signal path of a reception signal are improved.

In addition, the areas of the land electrodes 56a, 56c and 56e, which are held at the ground potential, are made to be larger than the areas of the other land electrodes 56b, 56d and 56f, such that entry of a transmission signal from the land electrodes 54a, 54c and 54e side to the land electrodes 56b, 56d and 56f is prevented. As a result, the isolation characteristics of the signal path of a transmission signal and the signal path of a reception signal are improved.

In addition, in the package substrate 30c, pluralities of via hole conductors b7-1 to b7-3, b9-1 to b9-3 and b11-1 to b11-4 are respectively connected to the land electrodes 45a, 45c, 45e, 56a, 56c and 56e. As a result, the land electrodes 45a, 45c, 45e, 56a, 56c and 56e come to be more securely held at the ground potential. As a result, the isolation characteristics of the signal path of a transmission signal and the signal path of a reception signal are improved.

In addition, as a result of the land electrodes 45a, 45c, 45e, 56a, 56c and 56e being more securely held at the ground potential, the occurrence of electromagnetic field coupling between the signal path of a transmission signal and the signal path of a reception signal is significantly reduced or prevented.

Figure 15A:
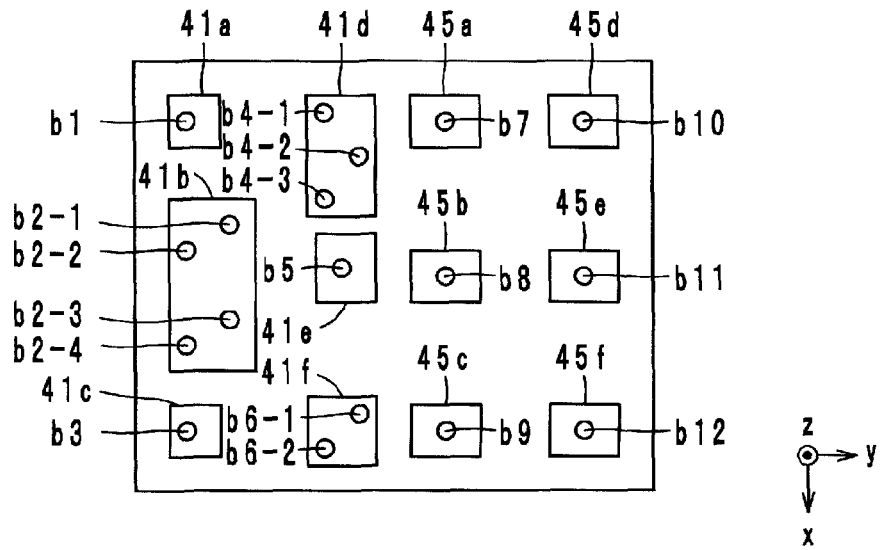
FIGS. 15A and 15B illustrates plan views of a package substrate according to a fourth modification of a preferred embodiment of the present invention.
Figure 15B:
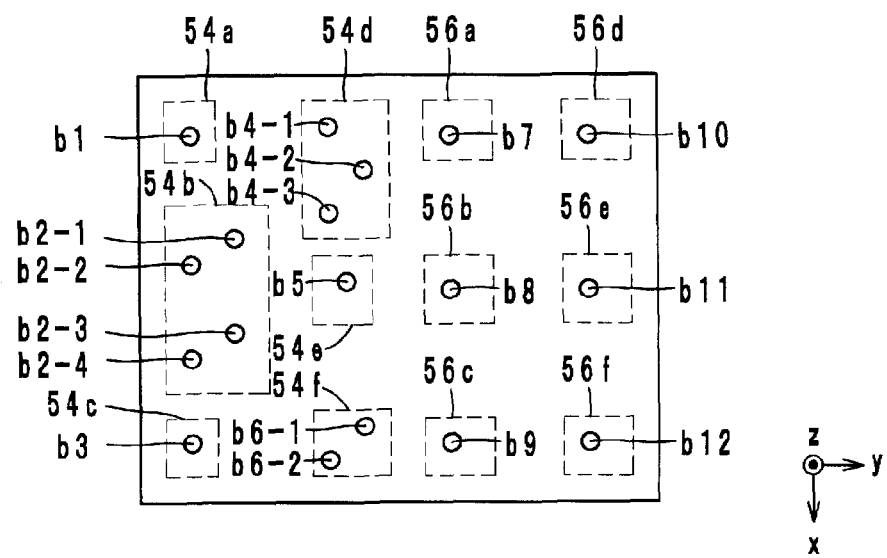

Next, a package substrate according to a fourth modification of a preferred embodiment of the present invention will be described with reference to the drawings. FIGS. 15A and 15B are plan views of a package substrate 30d according to the fourth modification.

The package substrate 30d and the package substrate 30a differ from each other in terms of the sizes of the land electrodes 41 and 45. In more detail, in the package substrate 30d, the sizes of the land electrodes 41 and 45 are not uniform. The areas of the land electrodes 41b, 41d and 41f connected to the land electrodes 62b, 62d and 62f are larger than the areas of the land electrodes 41a, 41c and 41e, which are not connected to the land electrodes 62b, 62d and 62f among the land electrodes 62a to 62f used when mounting the SAW filter component 32a.

In addition, the areas of the land electrodes 54b, 54d and 54f, which are connected to the land electrodes 41b, 41d and 41f connected to the land electrodes 62b, 62d and 62f, are larger than the areas of the land electrodes 54a, 54c and 54e connected to the land electrodes 41a, 41c and 41e, which are not connected to the land electrodes 62b, 62d and 62f among the land electrodes 62a to 62f used when mounting the SAW filter component 32a.

Thus, by making the areas of the land electrodes 41b, 41d and 41f, which are held at the ground potential, larger than the areas of the other land electrodes 41a, 41c and 41e, entry of a reception signal from the land electrodes 45b, 45d and 45e side to the land electrodes 41a, 41c and 41e is prevented. As a result, the isolation characteristics of the signal path of a transmission signal and the signal path of a reception signal are improved.

In addition, by making the areas of the land electrodes 54b, 54d and 54f, which are held at the ground potential, larger than the areas of the other land electrodes 54a, 54c and 54e, entry of a reception signal from the land electrodes 56b, 56d and 56f side to the land electrodes 54a, 54c and 54e is prevented. As a result, the isolation characteristics of the signal path of a transmission signal and the signal path of a reception signal are improved.

In addition, in the package substrate 30d, pluralities of via hole electrodes b2-1 to b2-4, b4-1 to b4-3 and b6-1 to b6-2 are respectively connected to the land electrodes 41b, 41d, 41f, 54b, 54d and 54f. Consequently, the land electrodes 41b, 41d, 41f, 54b, 54d and 54f come to be more securely held at the ground potential. As a result, the isolation characteristics of the signal path of a transmission signal and the signal path of a reception signal are improved.

In addition, as a result of the land electrodes 41b, 41d, 41f, 54b, 54d and 54f being more securely held at the ground potential, the occurrence of electromagnetic field coupling between the signal path of a transmission signal and the signal path of a reception signal is prevented.

Figure 16A:
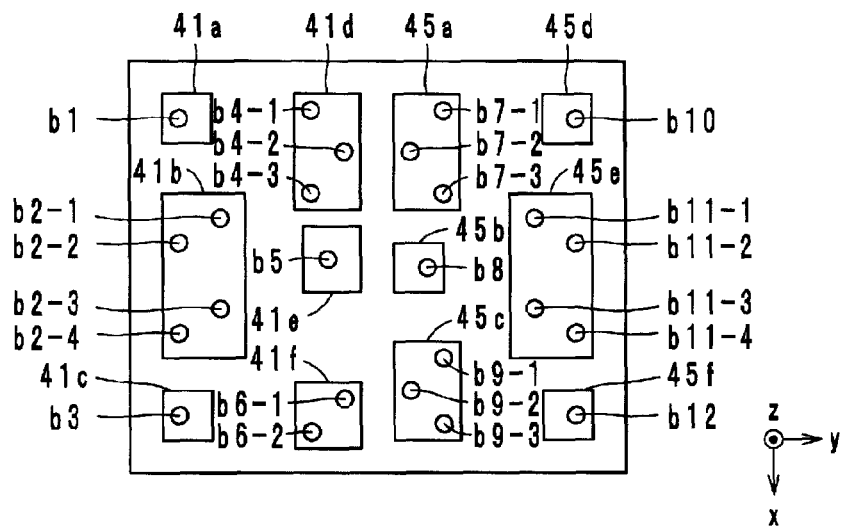
FIGS. 16A and 16B are plan views of a package substrate according to a fifth modification of a preferred embodiment of the present invention.
Figure 16B:
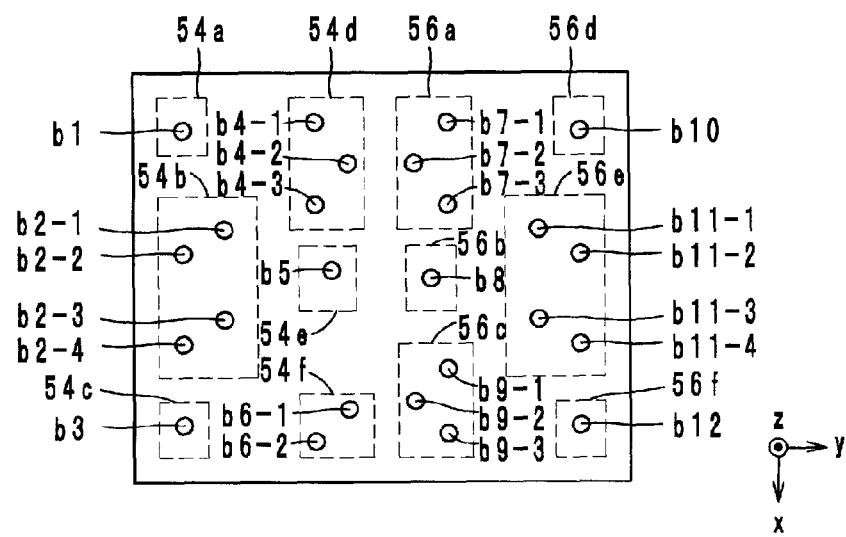

Next, a package substrate according to a fifth modification of a preferred embodiment of the present invention will be described with reference to the drawings. FIGS. 16A and 16B are plan views of a package substrate 30e according to the fifth modification.

As illustrated in FIG. 16A, the areas of the land electrodes 41b, 41d, 41f, 45a, 45c and 45e may be larger than the areas of the land electrodes 41a, 41c, 41e, 45b, 45d and 45f.

Similarly, as illustrated in FIG. 16B, the areas of the land electrodes 54b, 54d, 54f, 56a, 56c and 56e may be larger than the areas of the land electrodes 54a, 54c, 54e, 56b, 56d and 56f.

Figure 17A:
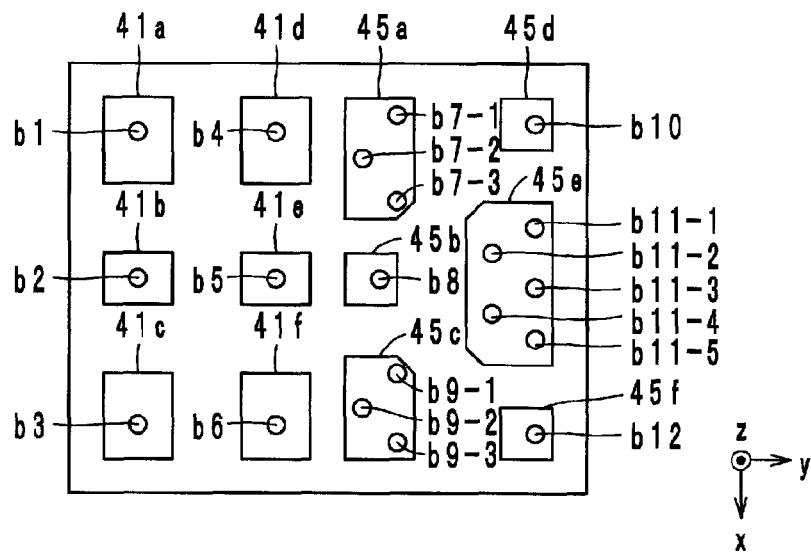
FIGS. 17A and 17B are plan views of a package substrate according to a sixth modification of a preferred embodiment of the present invention.
Figure 17B:
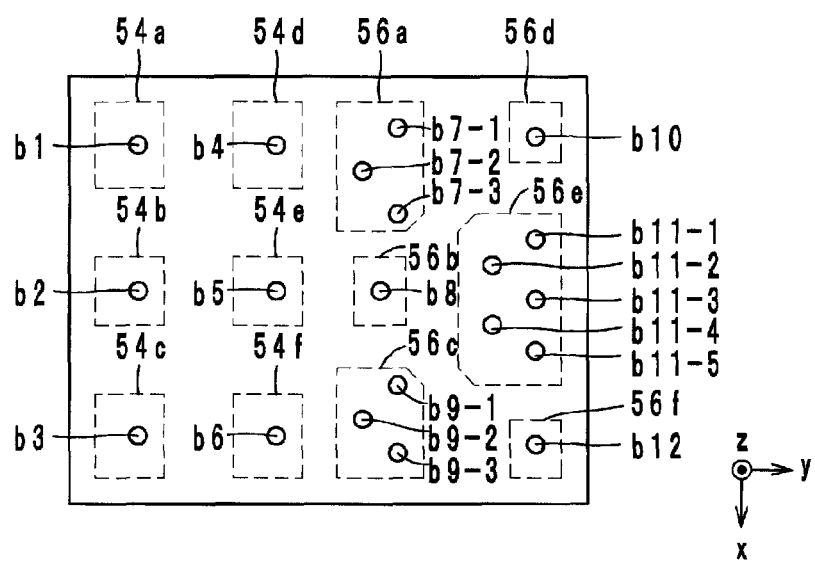

Next, a package substrate according to a sixth modification of a preferred embodiment of the present invention will be described with reference to the drawings. FIGS. 17A and 17B are plan views of a package substrate 30f according to the sixth modification.

The package substrate 30f and the package substrate 30a differ from each other in that the corners of the land electrodes 45 are subjected to chamfering. In more detail, opposing corners of the land electrodes 45a, 45c and 45e, which are connected to the land electrodes 66a, 66c and 66e, are subjected to chamfering. Here, the term "chamfering" indicates that the corners of the land electrodes 45a, 45c and 45e are cut off in a straight line.

In addition, opposing corners of the land electrodes 56a, 56c and 56e, which are connected to the land electrodes 45a, 45c and 45e connected to the land electrodes 66a, 66c and 66e, are subjected to chamfering.

With the above-described package substrate 30f, the distances between the land electrodes 45a, 45c and 45e are increased. Thus, shorts between the land electrodes 45 at the time of mounting are prevented.

Figure 18A:
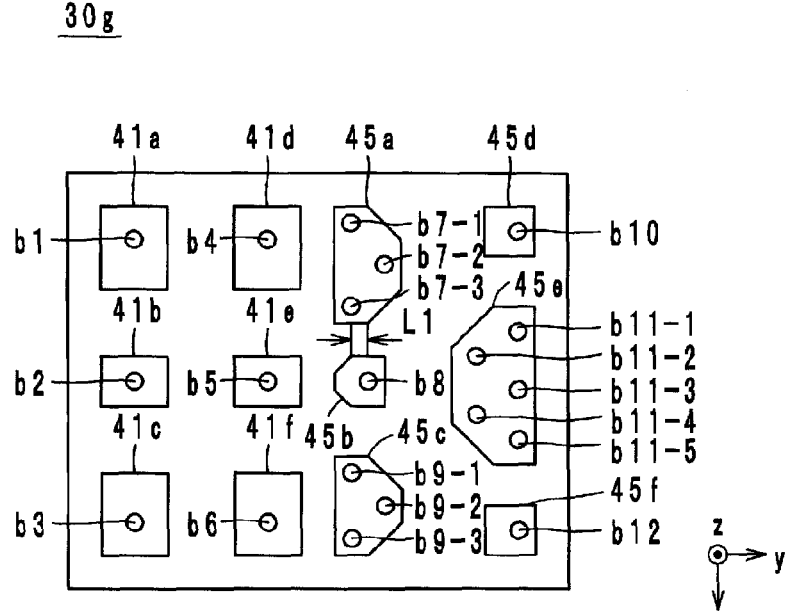
FIGS. 18A and 18B are plan views of a package substrate according to a seventh modification of a preferred embodiment of the present invention.
Figure 18B:
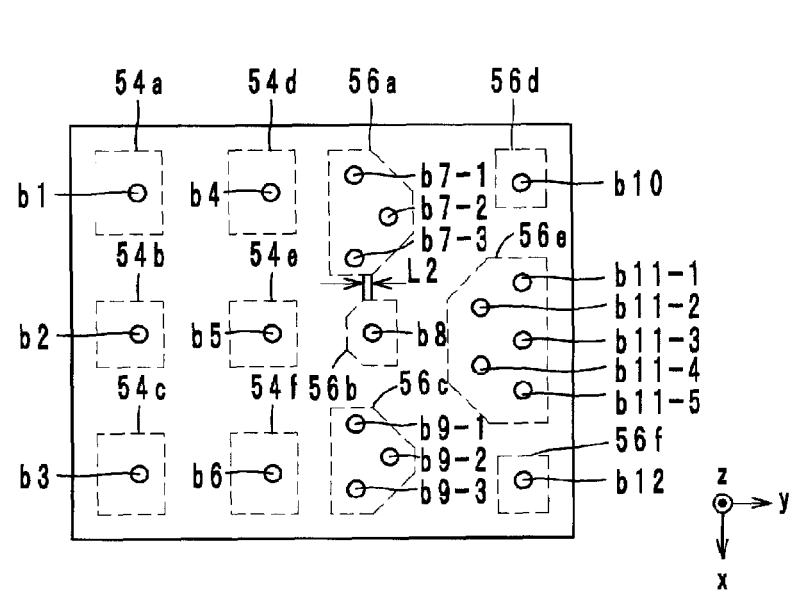

Next, a package substrate according to a seventh modification a preferred embodiment of the present invention will be described with reference to the drawings. FIGS. 18A and 18B are plan views of a package substrate 30g according to the seventh modification.

The package substrate 30g and the package substrate 30f differ from each other in that the corners of the land electrodes 45b and 56b are subjected to chamfering. In more detail, corners of the land electrode 45b positioned at both ends of the edge on the negative side in the y-axis direction are subjected to chamfering. Thus, a length L1 of a portion across which an edge of the land electrode 45b on the negative side in the x-axis direction opposes an edge of the land electrode 45a on the positive side in the x-axis direction becomes shorter. Similarly, a length L1 of a portion across which an edge of the land electrode 45b on the positive side in the x-axis direction opposes an edge of the land electrode 45c on the negative side in the x-axis direction becomes shorter. Thus, the stray capacitances generated between the land electrode 45b and the land electrodes 45a and 45c are reduced.

Corners of the land electrode 56b positioned at both ends of the edge on the negative side in the y-axis direction are subjected to chamfering. Thus, a length L2 of a portion across which an edge of the land electrode 56b on the negative side in the x-axis direction opposes an edge of the land electrode 56a on the positive side in the x-axis direction becomes shorter. Similarly, a length L2 of a portion across which an edge of the land electrode 56b on the positive side in the x-axis direction opposes an edge of the land electrode 56c on the negative side in the x-axis direction becomes shorter. Thus, the stray capacitances generated between the land electrode 56b and the land electrodes 56a and 56c are significantly reduced.

Figure 19A:
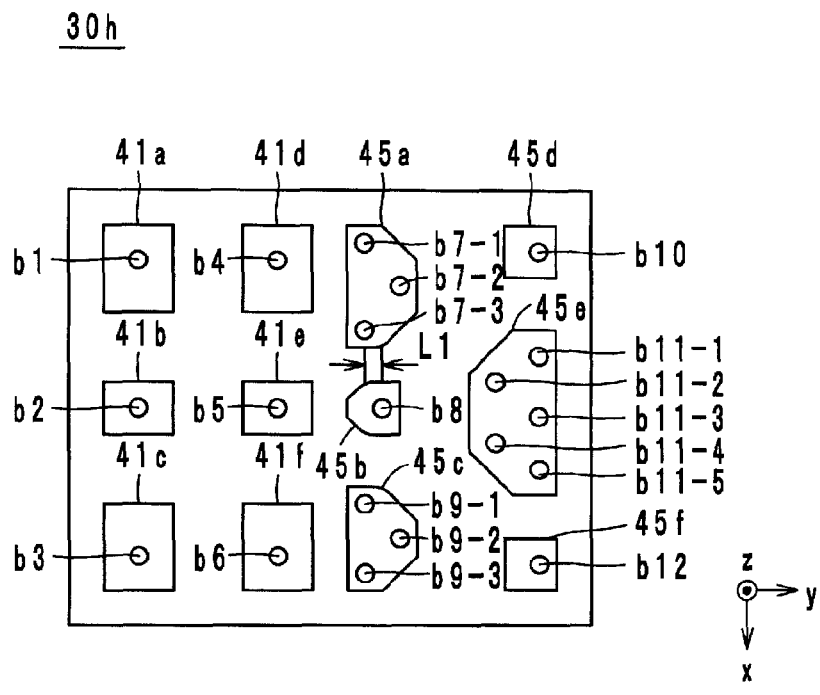
FIGS. 19A and 19B are plan views of a package substrate according to an eighth modification of a preferred embodiment of the present invention.
Figure 19B:
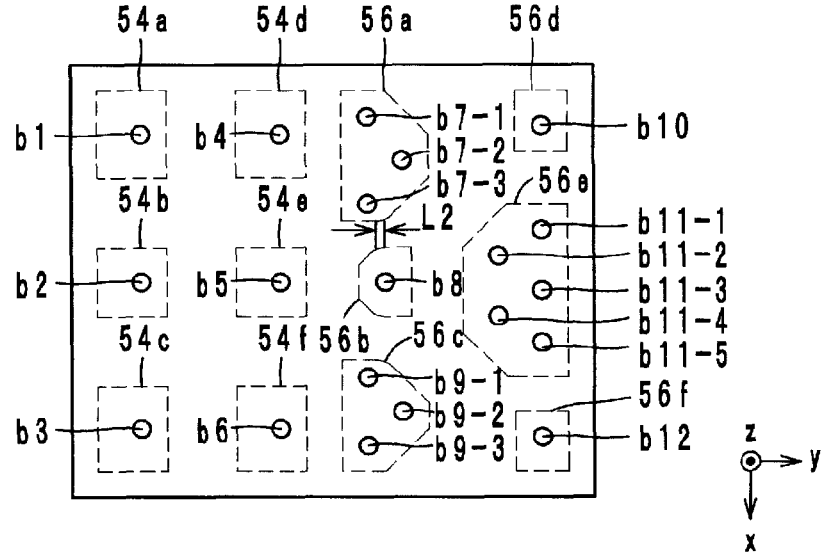

Next, a package substrate according to an eighth modification of a preferred embodiment of the present invention will be described with reference to the drawings. FIGS. 19A and 19B are plan views of a package substrate 30h according to the eighth modification.

The package substrate 30h and the package substrate 30g differ from each other in that the corners of the land electrodes 45b and 56b are subjected to rounded chamfering. Thus, a length L1 of a portion across which an edge of the land electrode 45b on the negative side in the x-axis direction opposes an edge of the land electrode 45a on the positive side in the x-axis direction becomes shorter. Similarly, a length L1 of a portion across which an edge of the land electrode 45b on the positive side in the x-axis direction opposes an edge of the land electrode 45c on the negative side in the x-axis direction becomes shorter. Thus, the stray capacitances generated between the land electrode 45b and the land electrodes 45a and 45c are further reduced.

In addition, a length L2 of a portion across which an edge of the land electrode 56b on the negative side in the x-axis direction opposes an edge of the land electrode 56a on the positive side in the x-axis direction becomes shorter. Similarly, a length L2 of a portion across which an edge of the land electrode 56b on the positive side in the x-axis direction opposes an edge of the land electrode 56c on the negative side in the x-axis direction becomes shorter. Thus, the stray capacitances generated between the land electrode 56b and the land electrodes 56a and 56c are further reduced.

Figure 20:
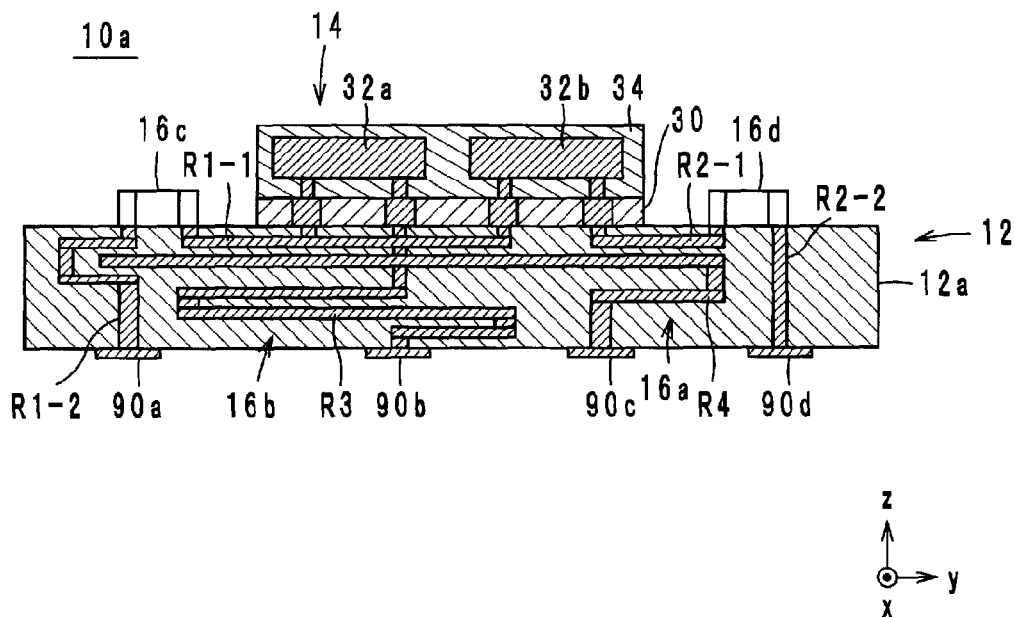
FIG. 20 is a sectional structural view of a substrate module according to a first modification of a preferred embodiment of the present invention.

Next, a substrate module 10a according to a first modification of a preferred embodiment of the present invention will be described with reference to the drawings. FIG. 20 is a sectional structural view of the substrate module 10a according to a first modification of a preferred embodiment of the present invention.

As illustrated in FIG. 2, the substrate module 10 includes the matching elements 16a to 16d. As illustrated in FIG. 1, the matching elements 16a to 16d are mounted on the mounting substrate 12 in the substrate module 10. In contrast, in the substrate module 10a, the matching elements 16a and 16b among the plurality of matching elements 16a to 16d that realize impedance matching with the duplexer 14 are built into the mounting substrate 12. On the other hand, the matching elements 16c and 16d among the plurality of matching elements 16a to 16d are mounted on the mounting substrate 12. A ground path R4, which is a ground path provided inside the mounting substrate 12 and is held at the ground potential, is provided between the matching element 16b and the matching element 16c.

In more detail, the mounting substrate 12 includes a substrate body 12a, an antenna path R1, reception paths R2-1 and R2-2, a transmission path R3, a ground path R4 and outer electrodes 90a to 90d. The substrate body 12a is a multilayer substrate preferably formed by stacking a plurality of insulator layers on top of one another.

The outer electrodes 90a to 90d are provided on a main surface of the substrate body 12a on the negative side in the z-axis direction and are used when mounting the substrate module 10 on a motherboard of a cellular phone. An antenna, which is provided on the motherboard, is connected to the outer electrode 90a. A transmission circuit, which is provided on the motherboard, is connected to the outer electrode 90b. A ground electrode, which is provided on the motherboard, is connected to the outer electrode 90c. A reception circuit, which is provided on the motherboard, is connected to the outer electrode 90d.

An antenna path R1-1 preferably includes via hole conductors and conductor layers and provides an electrical connection between the SAW filters 32a and 32b and the matching element 16c. An antenna path R1-2 preferably includes via-hole conductors and conductor layers and provides an electrical connection between the matching element 16c and the outer electrode 90a.

The reception path R2-1 preferably includes via hole conductors and conductor layers and provides an electrical connection between the SAW filter 32b and the matching element 16d. The reception path R2-2 preferably includes via-hole conductors and conductor layers and provides an electrical connection between the matching element 16d and the outer electrode 90d.

The transmission path R3 preferably includes via-hole conductors and conductor layers and provides an electrical connection between the outer electrode 90b and the SAW filter 32a. The transmission path R3 is wound and thus defines the matching element 16b. The conductor layers of the transmission path R3 may have a spiral or meandering shape.

The ground path R4 preferably includes via hole conductors and conductor layers and is connected to the outer electrode 90c. The ground path R4 is wound and thus defines the matching element 16a. The conductor layers of the ground path R4 may have a spiral or meandering shape.

Here, as illustrated in FIG. 20, the ground path R4 extends between the matching element 16b, which preferably includes the transmission path R3, and the matching element 16c, which is mounted on the substrate body 12a. Thus, isolation of the antenna paths R1-1 and R1-2 and the transmission path R3 from one another is improved.

Figure 21:
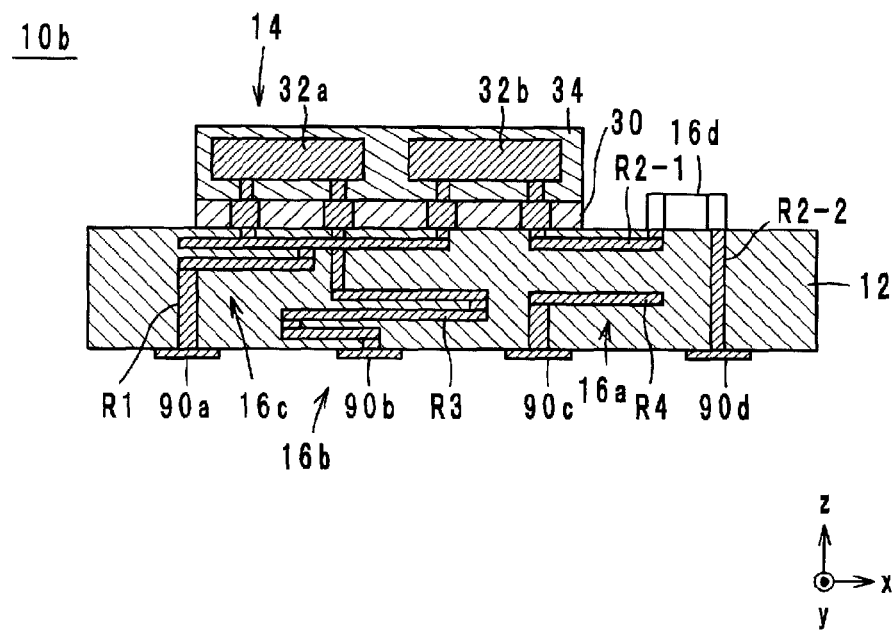
FIG. 21 is a sectional structural view of a substrate module according to a second modification of a preferred embodiment of the present invention.

Next, a substrate module 10b according to a second modification of a preferred embodiment of the present invention will be described with reference to the drawings. FIG. 21 is a sectional structural view of the substrate module 10b according to the second modification.

The substrate module 10b and the substrate module 10a differ from each other in whether the matching element 16c is provided inside the mounting substrate 12. In the substrate module 10b, the antenna path R1 preferably includes via hole conductors and conductor layers and provides an electrical connection between the SAW filters 32a and 32b and the outer electrode 90a. The antenna path R1 is wound and thus defines the matching element 16c. The conductor layers of the antenna path R1 may have a spiral or meandering shape.

In addition, the matching element 16b, which preferably includes the transmission path R3, and the matching element 16c, which preferably includes the antenna path R1, are adjacent to each other. The matching element 16b and the matching element 16c are provided on different insulator layers. Thus, electromagnetic coupling of the matching element 16b and the matching element 16c is significantly reduced or prevented.

In addition, the matching element 16c is built into the mounting substrate 12 and therefore the substrate module 10b is reduced in size.

Figure 22:
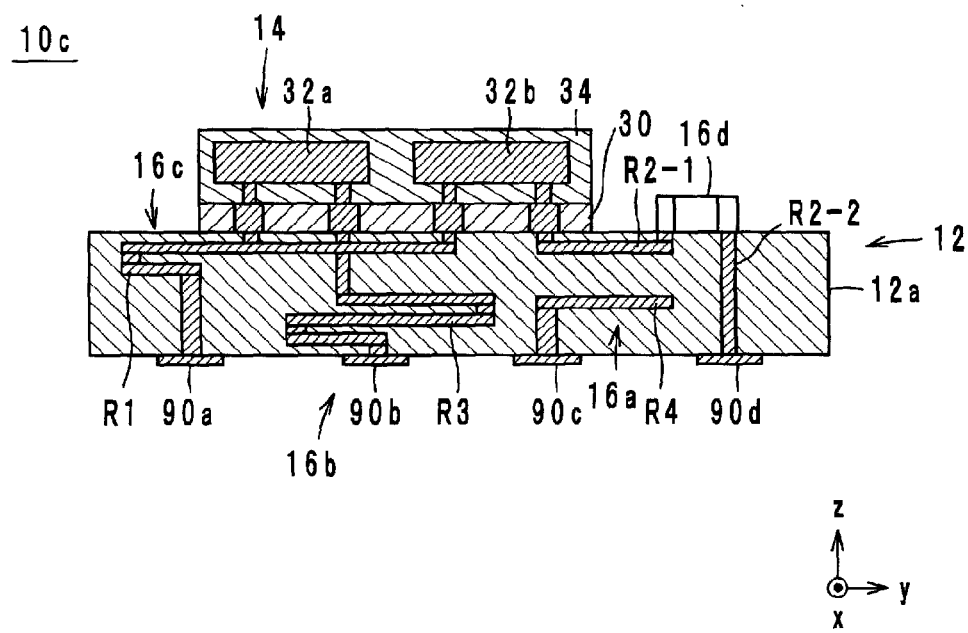
FIG. 22 is a sectional structural view of a substrate module according to a third modification of a preferred embodiment of the present invention.

Next, a substrate module 10c according to a third modification of a preferred embodiment of the present invention will be described with reference to the drawings. FIG. 22 is a sectional structural view of the substrate module 10c according to the third modification.

The substrate module 10c and the substrate module 10b differ from each other in terms of the position of the matching element 16c. In more detail, the matching element 16c of the substrate module 10c is provided at a position that is more greatly spaced away from the matching element 16b than the matching element 16c of the substrate module 10b is. In more detail, in the substrate module 10c, the matching element 16c and the matching element 16b are not superposed with each other when viewed in plan from the z-axis direction. Thus, electromagnetic coupling of the matching element 16b and the matching element 16c is more effectively reduced or prevented.

Figure 23:
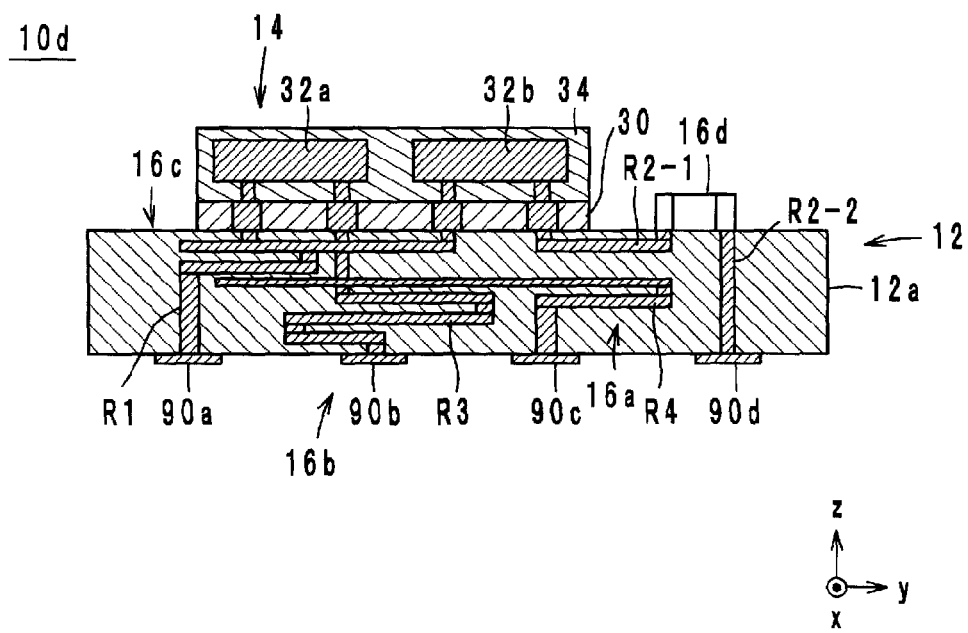
FIG. 23 is a sectional structural view of a substrate module according to a fourth modification of a preferred embodiment of the present invention.

Next, a substrate module 10d according to a fourth modification of a preferred embodiment of the present invention will be described with reference to the drawings. FIG. 23 is a sectional structural view of the substrate module 10d according to the fourth modification.

The substrate module 10d and the substrate module 10b differ from each other in terms of the shape of the ground path R4. In more detail, in the substrate module 10d, the ground path R4 is provided between the matching element 16b and the matching element 16d, which are adjacent to each other. Thus, electromagnetic coupling of the matching element 16b and the matching element 16c is more effectively reduced or prevented.

Figure 24:
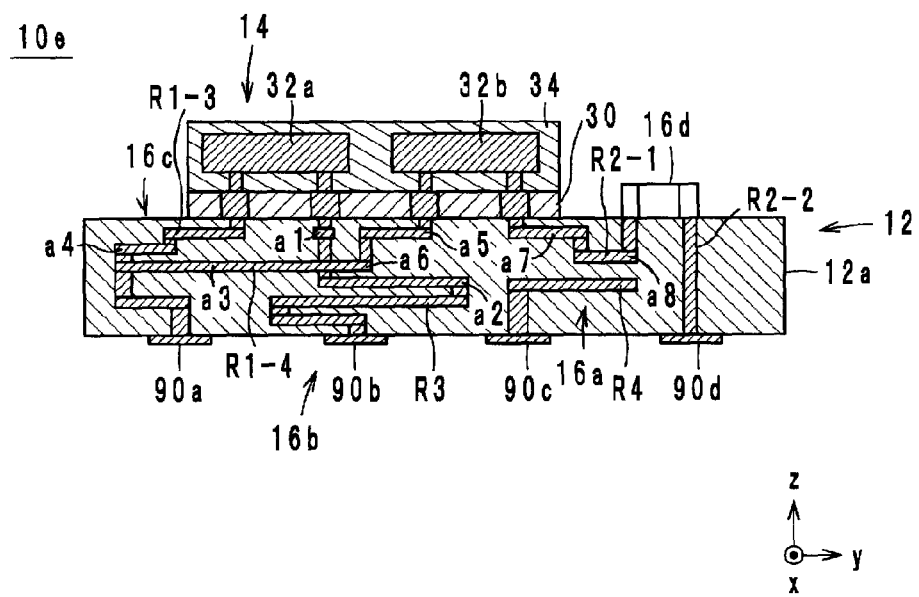
FIG. 24 is a sectional structural view of a substrate module according to a fifth modification of a preferred embodiment of the present invention.
Figure 25:
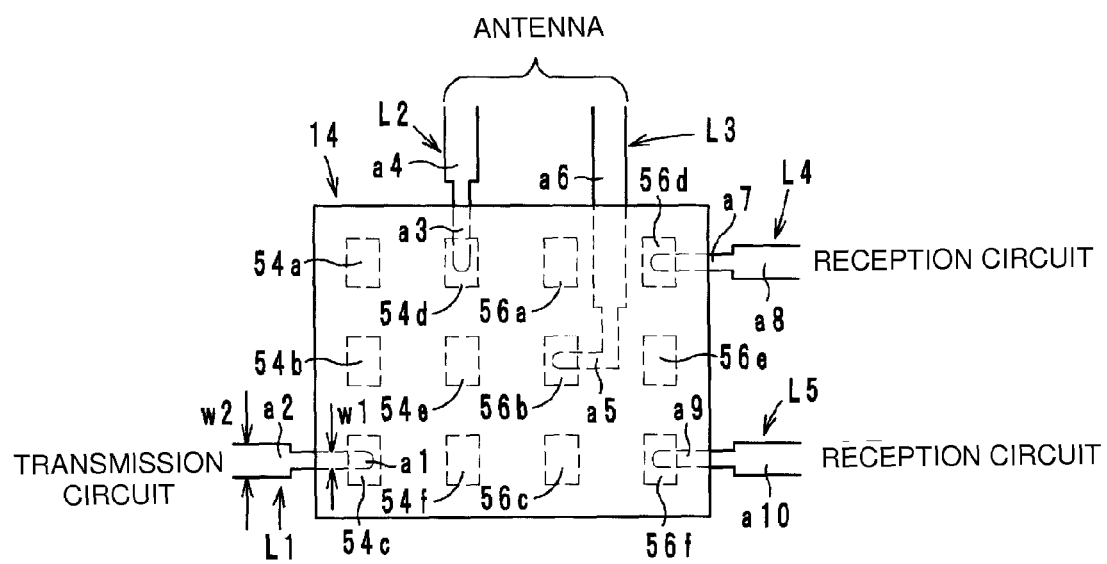
FIG. 25 illustrates a duplexer of the substrate module according to the fifth modification of a preferred embodiment of the present invention in plan view.

Next, a substrate module 10e according to a fifth modification of a preferred embodiment of the present invention will be described with reference to the drawings. FIG. 24 is a sectional structural view of the substrate module 10e according to the fifth modification. FIG. 25 illustrates a duplexer 14 of the substrate module 10e according to the fifth modification in plan view.

As illustrated in FIG. 24, the mounting substrate 12 of the substrate module 10e preferably includes the substrate body 12a, antenna paths R1-3 and R1-4, reception paths R2-1 and R2-2, the transmission path R3, the ground path R4 and the outer electrodes 90a to 90d. The substrate body 12a is a multilayer substrate preferably formed by stacking a plurality of insulator layers on top of one another.

The outer electrodes 90a to 90d are provided on a main surface of the substrate body 12a on the negative side in the z-axis direction and are used when mounting the substrate module 10e on a motherboard of a cellular phone. An antenna, which is provided on the motherboard, is connected to the outer electrode 90a. A transmission circuit, which is provided on the motherboard, is connected to the outer electrode 90b. A ground electrode, which is provided on the motherboard, is connected to the outer electrode 90c. A reception circuit, which is provided on the motherboard, is connected to the outer electrode 90d.

The antenna path R1-3 preferably includes via hole conductors and conductor layers and provides an electrical connection between the SAW filter 32a and the outer electrode 90a. The antenna path R1-4 preferably includes via hole conductors and conductor layers and provides an electrical connection between the SAW filter 32b and the outer electrode 90a. The antenna path R1-3 and the antenna path R1-4 merge with each other and are connected to the outer electrode 90a.

The reception path R2-1 preferably includes via hole conductors and conductor layers and provides an electrical connection between the SAW filter 32b and the matching element 16d. The reception path R2-2 preferably including via-hole conductors and conductor layers and provides an electrical connection between the matching element 16d and the outer electrode 90d.

The transmission path R3 preferably includes via-hole conductors and conductor layers and provides an electrical connection between the outer electrode 90b and the SAW filter 32a. The transmission path R3 is wound and thus defines the matching element 16b. The conductor layers of the transmission path R3 may have a spiral or meandering shape.

The ground path R4 preferably includes via hole conductors and conductor layers and is connected to the outer electrode 90c. The ground path R4 is wound and thus defines the matching element 16a. The conductor layers of the ground path R4 may have a spiral or meandering shape.

The transmission line R3, the antenna paths R1-3 and R1-4 and the reception paths R2-1 and R2-2, as illustrated in FIG. 25, are respectively defined by wiring line conductors L1 to L5. That is, the mounting substrate 12 is additionally provided with the wiring line conductors L1 to L5.

The wiring line conductors L1 to L5, as illustrated in FIG. 25, are respectively electrically connected to the land electrodes 54c, 54d, 56b, 56d and 56f of the duplexer 14. In FIG. 25, wiring line conductors connected to the lands 54a, 54b, 54e, 54f, 56a, 56c and 56e are not illustrated.

The wiring line conductor L1 includes wiring line portions a1 and a2. The wiring line portions a1 and a2 are line-shaped conductor layers provided inside the substrate body 12a. One end of the wiring line portion a1 is connected to the land electrode 54c. The wiring line portion a2, as illustrated in FIG. 24 and FIG. 25, is connected to the other end of the wiring line portion a1 via a via hole conductor. Thus, the wiring line a1 and the wiring line a2 are provided on different insulator layers in the substrate body 12a. In addition, as illustrated in FIG. 25, a line width w2 of the wiring line a2 is larger than a line width w1 of the wiring line a1.

The wiring line conductor L2 includes wiring line portions a3 and a4. The wiring line portions a3 and a4 are line-shaped conductor layers provided inside the substrate body 12a. One end of the wiring line portion a3 is connected to the land electrode 54d. The wiring line portion a4, as illustrated in FIG. 24 and FIG. 25, is connected to the other end of the wiring line portion a3 via a via hole conductor. Thus, the wiring line a3 and the wiring line a4 are provided on different insulator layers in the substrate body 12a. In addition, as illustrated in FIG. 25, a line width w2 of the wiring line a4 is larger than a line width w1 of the wiring line a3.

The wiring line conductor L3 includes wiring line portions a5 and a6. The wiring line portions a5 and a6 are line-shaped conductor layers provided inside the substrate body 12a. One end of the wiring line portion a5 is connected to the land electrode 56b. The wiring line portion a6, as illustrated in FIG. 24 and FIG. 25, is connected to the other end of the wiring line portion a5 via a via hole conductor. Thus, the wiring line a5 and the wiring line a6 are provided on different insulator layers in the substrate body 12a. In addition, as illustrated in FIG. 25, a line width w2 of the wiring line a6 is larger than a line width w1 of the wiring line a5.

The wiring line conductor L4 includes wiring line portions a7 and a8. The wiring line portions a7 and a8 are line-shaped conductor layers provided inside the substrate body 12a. One end of the wiring line portion a7 is connected to the land electrode 56d. The wiring line portion a8, as illustrated in FIG. 24 and FIG. 25, is connected to the other end of the wiring line portion a7 via a via hole conductor. Thus, the wiring line a7 and the wiring line a8 are provided on different insulator layers in the substrate body 12a. In addition, as illustrated in FIG. 25, a line width w2 of the wiring line a8 is larger than a line width w1 of the wiring line a7.

The wiring line conductor L5 includes wiring line portions a9 and a10. The wiring line portions a9 and a10 are line-shaped conductor layers provided inside the substrate body 12a. One end of the wiring line portion a9 is connected to the land electrode 56f. The wiring line portion a10, as illustrated in FIG. 24 and FIG. 25, is connected to the other end of the wiring line portion a9 via a via hole conductor. Thus, the wiring line a9 and the wiring line a10 are provided on different insulator layers in the substrate body 12a. In addition, as illustrated in FIG. 25, a line width w2 of the wiring line a10 is larger than a line width w1 of the wiring line a9.

With the thus-configured substrate module 10e, isolation characteristics can be improved. In more detail, if the substrate module 10e is reduced in size, the land electrodes and 56 come closer to each other and the wiring line conductors L1 to L5 come closer to each other. In such a case, there is a risk of a high-power transmission signal entering the reception circuits from the land electrodes 56d and 56f. Consequently, the isolation characteristics are liable to be degraded.

Accordingly, in the substrate module 10e, first ends of the wiring line portions a1, a3, a5, a7 and a9 are respectively connected to the land electrodes 54c, 54d, 56b, 56d and 56f. In addition, the wiring line portions a2, a4, a6, a8 and a10 are respectively connected to second ends of the wiring lines a1, a3, a5, a7 and a9 and have a thicker line width w2 than the line width w1 of the wiring line portions a1, a3, a5, a7 and a9. Thus, the distances between the wiring line conductors L1 to L5 are increased in the vicinities of the land electrodes 54c, 54d, 56b, 56d and 56f. As a result, the isolation characteristics of the wiring line conductors L1 to L5 are improved.

In addition, in the substrate module 10e, for example an amplifier or a switch IC may be connected in a stage prior to or subsequent to the duplexer 14. Consequently, by making the line width w1 of the wiring line portions a1, a3, a5, a7 and a9 be smaller than the line width w2 of the wiring line portions a2, a4, a6, a8 and a10, impedance matching can be obtained between the amplifier or switch IC and the wiring line portions a1, a3, a5, a7 and a9.

In addition, in the substrate module 10e, impedance matching can be easily obtained for the wiring line conductors L1 to L5. In more detail, since the wiring line portions a1, a3, a5, a7 and a9 and the wiring line portions a2, a4, a6, a8 and a10 are provided on different insulator layers, there is an insulator layer between the wiring line portions a1, a3, a5, a7 and a9 and the wiring line portions a2, a4, a6, a8 and a10. Therefore, the dielectric constant of the insulator layer can be utilized in impedance matching of the wiring line portions a1, a3, a5, a7 and a9 and the wiring line portions a2, a4, a6, a8 and a10. Thus, impedance matching can be easily obtained for the wiring line conductors L1 to L5.

In addition, by providing the wiring line portion a1, through which a transmission signal is transmitted, and the wiring line portions a7 and a9, through which reception signals are transmitted, on different insulator layers, the distance between the wiring line conductor L1 and the wiring line conductors L4 and L5 can be made large. As a result, entry of a transmission signal into a reception circuit from the land electrodes 56d and 56f is prevented. That is, the isolation characteristics are improved.

In the wiring line conductors L4 and L5, which are connected to the reception circuits, the line width w1 of the wiring line portions a7 and a9 may be narrower than the line width w2 of the wiring line portions a8 and a10, and in the wiring line conductor L1, which is connected to the transmission circuit, the line width w1 of the wiring line portion a1 and the line width w2 of the wiring line portion a2 may be made the same as each other. Also with this configuration, entry of a transmission signal into a reception circuit from the land electrodes 56d and 56f is prevented. That is, the isolation characteristics are improved. In addition, in the wiring line conductor L1, which is connected to the transmission circuit, the line width w1 of the wiring line portion a1 is not narrower than the line width w2 of the wiring line portion a2 and therefore loss at the time of transmission of a transmission signal is reduced.

Package substrates, duplexers and substrate modules according to the present invention are not limited to those described in the above preferred embodiments and modifications thereof, and can be modified within the scope of the present invention.

In the package substrate 30, the land electrodes 41 and 45 include the mounting portions 42 and 46 and the connection portions 44 and 48 and the land electrodes 54 and 56 preferably have a rectangular or substantially rectangular shape. However, similarly to the land electrodes of the package substrate 30, the land electrodes 54 and 56 may also include mounting portions and connection portions. In such a case, the via hole conductors b25 to b36 would be connected to the connection portions of the land electrodes 54 and 56.

In addition, in the package substrate 30, the connection conductors 50 and 52 are all provided on the front surface of the insulator layer 40b. However, in the case where the substrate body 39 includes four or more insulator layers 40, it would be preferable to provide adjacent connection conductors 50 and 52 on different insulator layers 40. By doing this, the distance between the connection conductors 50 and 52 can be increased and the isolation characteristics of a signal path of a transmission signal and a signal path of a first reception signal and a signal path of a second reception signal in the duplexer 14 can be improved.

In the SAW filter 32a, similarly to the SAW filter 32b, the land electrodes 62a, 62c, 62d and 62f, which are grounded, need not be connected to each other by a ground line. That is, the land electrodes 62a, 62c, 62d and 62f need not be electrically connected to each other in the SAW filter 32a.

As has been described above, various preferred embodiments of the present invention are applicable for use in substrates, duplexers and substrate modules and are excellent in that isolation characteristics of a high-frequency-side signal path and a low-frequency-side signal path can be improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A duplexer comprising:
   a substrate comprising:
      a substrate body including a first main surface and a second main surface that oppose each other;
      a plurality of first mounting electrodes that are provided on the first main surface and that connect the high-frequency-side filter component or the low-frequency-side filter component; and
      a plurality of second mounting electrodes that are provided on the second main surface and that connect a mounting substrate on which the duplexer is mounted, the plurality of second mounting electrodes being superposed with the plurality of first mounting electrodes when viewed in plan from a direction normal to the first main surface; wherein
      the first mounting electrodes and the second mounting electrodes, which are superposed with one another when viewed in plan from a direction normal to the first main surface, are electrically connected to each other;
   a high-frequency-side filter component mounted on the first main surface of the substrate; and
   a low-frequency-side filter component mounted on the first main surface of the substrate; wherein
   the low-frequency-side filter component includes a plurality of second ground electrodes that are connected to the first mounting electrodes and the plurality of second ground electrodes are not electrically connected to each other in the low-frequency-side filter component.

2. The duplexer according to claim 1, wherein an area of the second mounting electrodes that are connected to the first mounting electrodes that are connected to the second ground electrodes is larger than an area of the second mounting electrodes connected to the first mounting electrodes that are not connected to the second ground electrodes among the first mounting electrodes used when mounting the low-frequency-side filter component.

3. The duplexer according to claim 1, wherein the plurality of first mounting electrodes are not electrically connected to each other in the substrate body, and the plurality of second mounting electrodes are not electrically connected to each other in the substrate body.

4. The duplexer according to claim 1, further comprising:
   first via hole conductors that are connected to the first mounting electrodes and extend in a direction normal to the first main surface inside the substrate body; wherein
   the first mounting electrodes each include a first mounting portion used to connect the high-frequency-side filter component or the low-frequency-side filter component, and a first connection portion to which a corresponding one of the first via hole conductors is connected.

5. The duplexer according to claim 1, further comprising:
   second via hole conductors that are connected to the second mounting electrodes and extend in a direction normal to the first main surface inside the substrate body; wherein
   the second mounting electrodes each include a second mounting portion used to connect the mounting substrate, and a second connection portion to which a corresponding one of the second via hole conductors is connected.

6. The duplexer according to claim 1, further comprising:
   first via hole conductors that are connected to the first mounting electrodes and extend in a direction normal to the first main surface inside the substrate body;
   second via hole conductors that are connected to the second mounting electrodes and extend in a direction normal to the first main surface inside the substrate body; and
   connection conductors that are built into the substrate body and provide connections between the first via hole conductors and the second via hole conductors.

7. The duplexer according to claim 6, wherein the first via hole conductors, the second via hole conductors and the connection conductors are arranged so as to correspond to the plurality of first mounting electrodes and the plurality of second mounting electrodes, and the plurality of connection conductors are not electrically connected to each other in the substrate body.

8. The duplexer according to claim 6, wherein
the first via hole conductors, the second via hole conductors and the connection conductors are arranged so as to correspond to the plurality of first mounting electrodes and the plurality of second mounting electrodes; and
the substrate includes a plurality of insulator layers stacked on top of one another and adjacent connection conductors provided on different insulator layers.

9. The duplexer according to claim 1, further comprising via hole conductors that are connected to the first mounting electrodes and the second mounting electrodes and extend in a direction normal to the first main surface inside the substrate body.

10. The duplexer according to claim 1, wherein the high-frequency side filter component includes a plurality of first ground electrodes that are connected to the first mounting electrodes and the plurality of first ground electrodes are not electrically connected to each other in the high-frequency-side filter component.

11. The duplexer according to claim 1, wherein an area of the first mounting electrodes that are connected to the second ground electrodes is larger than an area of the first mounting electrodes that are not connected to the second ground electrodes among the first mounting electrodes used when mounting the low-frequency-side filter component.

12. The duplexer according to claim 11, wherein opposing corners of the first mounting electrodes connected to the second ground electrodes include chamfered portions.

13. The duplexer according to claim 11, wherein opposing corners of the second mounting electrodes that are connected to the first mounting electrodes that are connected to the second ground electrodes include chamfered portions.

14. A substrate module comprising:
a mounting substrate; and
the duplexer according to claim 1 mounted on the mounting substrate.

15. The substrate module according to claim 14, wherein a matching element that provides impedance matching with the duplexer is built into the mounting substrate.

16. The substrate module according to claim 15, wherein the mounting substrate is a multilayer substrate and the matching element includes a conductor layer and a via hole conductor provided inside the multilayer substrate and adjacent matching elements are provided on different layers inside the mounting substrate.

17. The substrate module according to claim 15, wherein a ground conductor layer that is held at a ground potential is provided between adjacent matching elements.

18. The substrate module according to claim 15, wherein
the mounting substrate is a multilayer substrate;
a first matching element among a plurality of matching elements that provide impedance matching with the duplexer is built into the mounting substrate;
a second matching element among the plurality of matching elements is mounted on the mounting substrate; and
a ground conductor layer that is held at a ground potential is provided inside the mounting substrate between the first matching element and the second matching element.

19. The substrate module according to claim 14, wherein
the mounting substrate includes a wiring line conductor that is electrically connected to one of the second mounting electrodes; and
the wiring line conductor includes:
a first wiring line portion including a first end connected to the second mounting electrode; and
a second wiring line portion connected to a second end of the first wiring line portion and having a larger line thickness that the first wiring line portion.

20. The substrate module according to claim 19, wherein the mounting substrate is a multilayer substrate including a plurality of insulator layers stacked on top of one another and the first wiring line portion and the second wiring line portion are provided on different insulator layers inside the multilayer substrate.

21. The substrate module according to claim 19, wherein a reception circuit is connected to the wiring line conductor.

* * * * *